(12) United States Patent
Inoue et al.

(10) Patent No.: US 11,282,992 B2
(45) Date of Patent: Mar. 22, 2022

(54) LIGHT-EMITTING MODULE PROVIDED WITH SEMICONDUCTOR LIGHT-EMITTING ELEMENT THAT EMITS DEEP ULTRAVIOLET LIGHT

(71) Applicant: NATIONAL INSTITUTE OF INFORMATION AND COMMUNICATIONS TECHNOLOGY, Koganei (JP)

(72) Inventors: Shinichiro Inoue, Koganei (JP); Manabu Taniguchi, Koganei (JP); Kosei Nakaya, Koganei (JP)

(73) Assignee: NATIONAL INSTITUTE OF INFORMATION AND COMMUNICATIONS TECHNOLOGY, Tokyo (JP)

( * ) Notice: Subject to any disclaimer, the term of this patent is extended or adjusted under 35 U.S.C. 154(b) by 0 days.

(21) Appl. No.: 15/733,009

(22) PCT Filed: Nov. 22, 2016

(86) PCT No.: PCT/JP2016/084545
§ 371 (c)(1),
(2) Date: May 22, 2019

(87) PCT Pub. No.: WO2018/096571
PCT Pub. Date: May 31, 2018

(65) Prior Publication Data
US 2019/0288167 A1    Sep. 19, 2019

(51) Int. Cl.
*H01L 33/58* (2010.01)
*H01L 33/26* (2010.01)
(Continued)

(52) U.S. Cl.
CPC .............. *H01L 33/58* (2013.01); *H01L 33/26* (2013.01); *H01L 33/501* (2013.01); *H01L 33/56* (2013.01)

(58) Field of Classification Search
CPC ........ H01L 33/58; H01L 33/26; H01L 33/501
See application file for complete search history.

(56) References Cited

U.S. PATENT DOCUMENTS 6,964,877 B2 * 11/2005 Chen .................... H01L 33/486
                                                    438/20
8,178,424 B2 *  5/2012 Kim ....................... H01L 33/58
                                                    438/463
(Continued)

FOREIGN PATENT DOCUMENTS

CN       1722479 A      1/2006
EP     1 142 926 A1    10/2001
(Continued)

OTHER PUBLICATIONS

Machine translation of JP2015-095588A in English whose original JPO document is disclosed by applicant's IDS filed May 22, 2019.*
(Continued)

*Primary Examiner* — Eugene Lee
(74) *Attorney, Agent, or Firm* — Keating & Bennett, LLP

(57) ABSTRACT

A light-emitting module includes: a semiconductor light-emitting element which emits deep ultraviolet light; a liquid sealing the semiconductor light-emitting element; and a package for accommodating the semiconductor light-emitting element and the liquid. The liquid is transparent to the deep ultraviolet light. The package has a transparent member transparent to the deep ultraviolet light. For that reason, a highly reliable light-emitting module provided with the semiconductor light-emitting element that emits the deep ultraviolet light can be provided.

19 Claims, 12 Drawing Sheets

(51) Int. Cl.
   *H01L 33/50* (2010.01)
   *H01L 33/56* (2010.01)

(56) References Cited

U.S. PATENT DOCUMENTS

| | | | | |
|---|---|---|---|---|
| 9,893,235 | B2* | 2/2018 | Kang | H01L 33/50 |
| 2001/0010449 | A1* | 8/2001 | Chiu | H01L 33/22 |
| | | | | 313/501 |
| 2004/0012958 | A1* | 1/2004 | Hashimoto | H01L 33/60 |
| | | | | 362/241 |
| 2004/0046242 | A1* | 3/2004 | Asakawa | H01L 31/0203 |
| | | | | 257/678 |
| 2006/0002101 | A1 | 1/2006 | Wheatley et al. | |
| 2006/0006404 | A1* | 1/2006 | Ibbetson | H01L 33/486 |
| | | | | 257/99 |
| 2006/0006793 | A1 | 1/2006 | Baroky et al. | |
| 2006/0012299 | A1* | 1/2006 | Suehiro | H01L 33/56 |
| | | | | 313/512 |
| 2006/0138443 | A1* | 6/2006 | Fan | H01L 33/56 |
| | | | | 257/100 |
| 2007/0182323 | A1* | 8/2007 | Ogata | H01L 24/97 |
| | | | | 313/512 |
| 2007/0189035 | A1 | 8/2007 | Wheatley et al. | |
| 2007/0267645 | A1 | 11/2007 | Nakata et al. | |
| 2007/0274098 | A1 | 11/2007 | Wheatley et al. | |
| 2010/0117070 | A1* | 5/2010 | Adekore | H01L 21/02403 |
| | | | | 257/43 |
| 2012/0218773 | A1* | 8/2012 | Peiler | F21V 5/04 |
| | | | | 362/520 |
| 2012/0286304 | A1* | 11/2012 | LeToquin | H05B 33/14 |
| | | | | 257/89 |
| 2013/0240931 | A1* | 9/2013 | Akimoto | H01L 33/005 |
| | | | | 257/98 |
| 2015/0064822 | A1 | 3/2015 | Gaska et al. | |
| 2016/0027970 | A1* | 1/2016 | Shatalov | H01L 24/97 |
| | | | | 438/27 |
| 2016/0149076 | A1* | 5/2016 | Kitano | H01L 33/26 |
| | | | | 257/98 |
| 2016/0163937 | A1 | 6/2016 | Inoue et al. | |
| 2016/0211425 | A1* | 7/2016 | Tsujimoto | H01L 33/22 |
| 2017/0290933 | A1* | 10/2017 | Collins | A61L 2/10 |
| 2018/0190877 | A1* | 7/2018 | Hirano | H01L 33/32 |
| 2018/0199433 | A1* | 7/2018 | Hirano | H05K 1/111 |
| 2018/0240936 | A1* | 8/2018 | Hong | H01L 33/04 |
| 2018/0248088 | A1 | 8/2018 | Inoue et al. | |
| 2019/0363224 | A1* | 11/2019 | Baretz | H01L 33/52 |

FOREIGN PATENT DOCUMENTS

| | | |
|---|---|---|
| JP | 2000-219694 A | 8/2000 |
| JP | 2002-217459 A | 8/2002 |
| JP | 2003-347601 A | 12/2003 |
| JP | 2005-026303 A | 1/2005 |
| JP | 2007-311707 A | 11/2007 |
| JP | 2008-505444 A | 2/2008 |
| JP | 2010-010474 A | 1/2010 |
| JP | 2014-146689 A | 8/2014 |
| JP | 2015-095588 A | 5/2015 |
| JP | 2016-127156 A | 7/2016 |
| WO | 2015/016150 A1 | 2/2015 |

OTHER PUBLICATIONS

Official Communication issued in International Patent Application No. PCT/JP2016/084545, dated Dec. 20, 2016.

Official Communication issued in Japanese Patent Application No. 2015-085410, dated Jan. 15, 2019.

Official Communication issued in corresponding Taiwanese Patent Application No. 105138218, dated Aug. 4, 2020.

Official Communication issued in corresponding Taiwanese Patent Application No. 105138218, dated Apr. 29, 2021.

* cited by examiner (A)

(B)

(A)

(B)

(A)

(B)

(A)

(B)

(C)

LIGHT-EMITTING MODULE PROVIDED WITH SEMICONDUCTOR LIGHT-EMITTING ELEMENT THAT EMITS DEEP ULTRAVIOLET LIGHT

TECHNICAL FIELD

The present invention relates to a light-emitting module provided with a semiconductor light-emitting element that emits deep ultraviolet light.

BACKGROUND ART

Conventionally, light-emitting modules are known which is provided with a semiconductor light-emitting element that emits infrared light or blue light sealed with a cured resin (see PTL 1). Semiconductor light-emitting elements which emit deep ultraviolet light are also known (see PTL 2).

CITATION LIST

Patent Literature

PTL 1: Japanese Patent Laying-Open No. 2002-217459
PTL 2: WO 2015/016150

SUMMARY OF INVENTION

Technical Problem

However, sealing a semiconductor light-emitting element, that emits the deep ultraviolet light, with a resin having a high transmittance to infrared light and blue light causes rapid drop over the emission period in intensity of the deep ultraviolet light output from the light-emitting module. For that reason, a problem with the light-emitting module that is provided with a semiconductor light-emitting element that emits deep ultraviolet light is low reliability. The significantly low reliability of the light-emitting module is a particular challenge associated with the semiconductor light-emitting element emitting the deep ultraviolet light.

The present invention is made in view of the above challenge and has an object to provide a highly reliable light-emitting module provided with a semiconductor light-emitting element that emits deep ultraviolet light.

Solution to Problem

A deep ultraviolet light-emitting module according to the present invention includes: a semiconductor light-emitting element which emits deep ultraviolet light; a liquid sealing the semiconductor light-emitting element; and a package for accommodating the semiconductor light-emitting element and the liquid. The liquid is transparent to the deep ultraviolet light emitted from the semiconductor light-emitting element. The package has a transparent member transparent to the deep ultraviolet light emitted from the semiconductor light-emitting element.

Advantageous Effects of Invention

According to the light-emitting module of the present invention, a highly reliable light-emitting module provided with the semiconductor light-emitting element that emits deep ultraviolet light is provided.

DESCRIPTION OF EMBODIMENTS

Hereinafter, embodiments according to the present invention will be described with reference to the accompanying drawings. Unless otherwise stated, like reference signs refer to like parts and the description will not be repeated.

Embodiment 1

Figure 1:
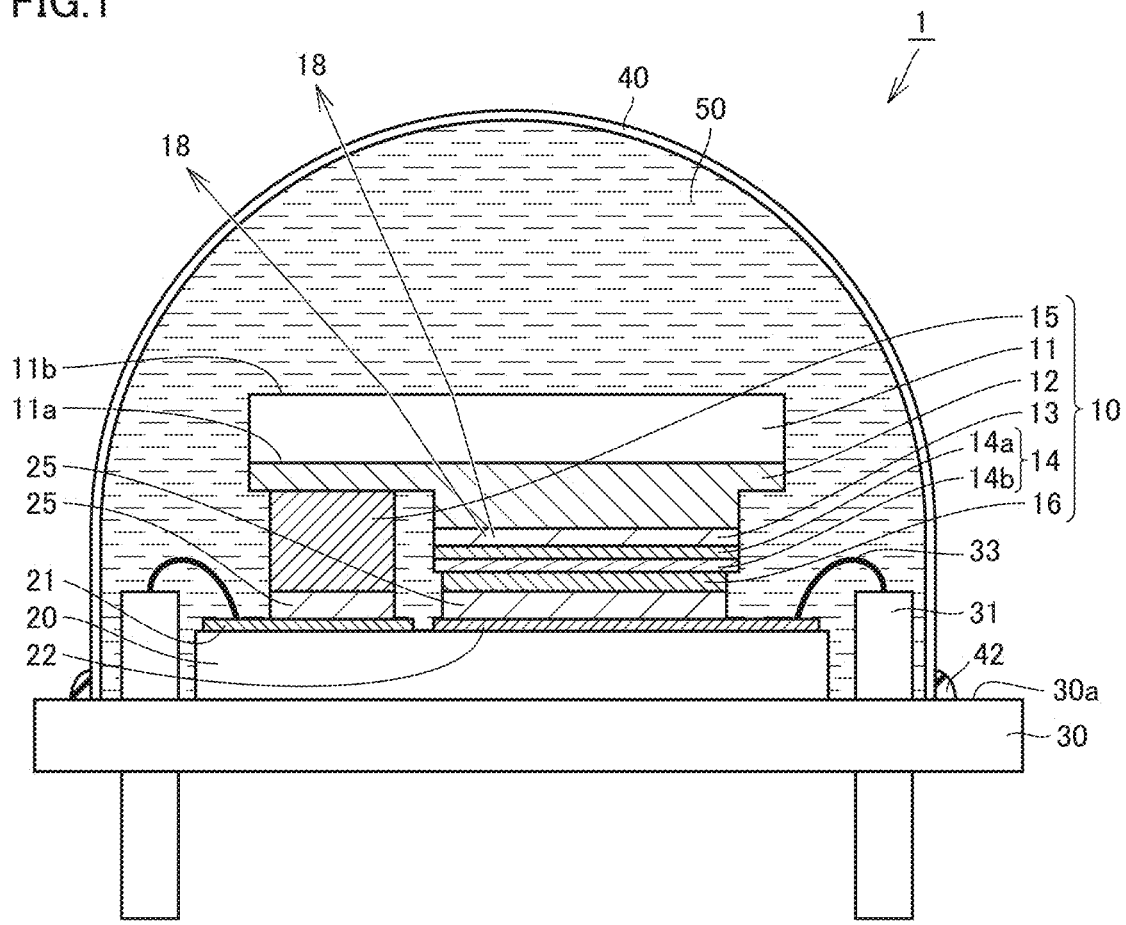
FIG. 1 is a schematic cross sectional view of a light-emitting module according to Embodiment 1.

Referring to FIG. 1, a light-emitting module 1 according to Embodiment 1 mainly includes: a semiconductor light-emitting element 10 which emits deep ultraviolet light 18; a liquid 50 sealing semiconductor light-emitting element 10;

and a package (30, 40) for accommodating semiconductor light-emitting element 10 and liquid 50.

The package (30, 40) accommodates semiconductor light-emitting element 10 and liquid 50. The package mainly includes a base 30 and a transparent member 40.

Semiconductor light-emitting element 10 is mounted on base 30. In the present embodiment, semiconductor light-emitting element 10 is mounted on base 30 via a sub-mount 20. Materials used for base 30 can include metals, resins, and ceramics. In the present specification, the package (30, 40) that includes base 30 made of a metal will be referred to as a metal package, the package (30, 40) that includes base 30 made of a resin will be referred to as a resin package, and the package (30, 40) that includes base 30 made of a ceramic will be referred to as a ceramic package. The package (30, 40) according to the present embodiment may be any of the metal package, the resin package, and the ceramic package. Base 30 may be composed of a highly thermally conductive material, and serve as a heat sink.

The package may further include sub-mount 20. Semiconductor light-emitting element 10 is mounted on sub-mount 20. Materials for sub-mount 20 can include aluminum nitride (AlN), alumina ($Al_2O_3$), silicon carbide (SiC), diamond, and silicon (Si). Preferably, sub-mount 20 is composed of a highly thermally conductive material. For that reason, preferably, sub-mount 20 may be composed of aluminum nitride (AlN) having a thermal conductivity of 160 to 250 W/(m·K). The surface on which semiconductor light-emitting element 10 is mounted may be flat or may be curved. In order to reflect deep ultraviolet light 18 from semiconductor light-emitting element 10, a reflective layer made of aluminum (Al), titanium (Ti), nickel (Ni), gold (Au), or silver (Ag) may be provided on the surface, of the sub-mount, on which the semiconductor light-emitting element 10 is mounted.

A first conductive pad 21 and a second conductive pad 22 may be provided on the surface of the sub-mount on which semiconductor light-emitting element 10 is mounted. Using a bond member 25 having electrical conductivity, an n-type electrode 15 of semiconductor light-emitting element 10 and first conductive pad 21 of sub-mount 20 are electrically and mechanically connected, and a p-type electrode 16 of semiconductor light-emitting element 10 and second conductive pad 22 of sub-mount 20 are electrically and mechanically connected. Examples of bond member 25 can include: solder made of, for example, gold-tin (AuSn) or silver-tin (AgSn); a metal bump made of, for example, gold (Au) or copper (Cu); and an electrically conductive paste such as silver paste.

In the present embodiment, semiconductor light-emitting element 10 may be flip chip bonded on sub-mount 20. In other words, semiconductor light-emitting element 10 may be mounted on sub-mount 20 in a manner that substrate 11 of semiconductor light-emitting element 10 is on a side opposite the sub-mount 20 and base 30 and the semiconductor layers (an n-type semiconductor layer 12, an active layer 13, a p-type semiconductor layer 14) of semiconductor light-emitting element 10 are on the side where sub-mount 20 and base 30 are present. Semiconductor light-emitting element 10 being flip chip bonded on sub-mount 20 allow deep ultraviolet light 18 emitted from active layer 13 to be extracted out of semiconductor light-emitting element 10, while reducing absorption, into p-type semiconductor layer 14, of deep ultraviolet light 18 emitted from active layer 13.

Sub-mount 20 is fixed to base 30, using eutectic solder made of, for example, gold-tin (AuSn), an electrically conductive paste such as silver paste, or an adhesive. In order to efficiently extract deep ultraviolet light 18 emitted from semiconductor light-emitting element 10 out of the package (30, 40), preferably semiconductor light-emitting element 10 is mounted near the center of a primary surface 30a of base 30.

The package according to the present embodiment may further include a lead pin 31 and a conductive wire 33. Lead pin 31 may be secured to base 30. Conductive wire 33 electrically connects lead pin 31 and first conductive pad 21 and connects lead pin 31 and second conductive pad 22. Examples of conductive wire 33 can include a gold (Au) wire. Current is supplied from an external power supply (not shown) to semiconductor light-emitting element 10 via lead pin 31, first conductive pad 21, second conductive pad 22, and bond member 25, and semiconductor light-emitting element 10 emits deep ultraviolet light 18.

Transparent member 40 may be provided on base 30 to cover semiconductor light-emitting element 10. Base 30 and transparent member 40 may be bonded together by an adhesive 42 or the like.

Transparent member 40 is transparent to deep ultraviolet light 18 emitted from semiconductor light-emitting element 10. In the present specification, transparent member 40 being transparent to deep ultraviolet light 18 emitted from semiconductor light-emitting element 10 means that transparent member 40 has a transmittance of 60% or greater in the wavelength of deep ultraviolet light 18 emitted from semiconductor light-emitting element 10. Transparent member 40 may have a transmittance of, preferably 75% or greater, and more preferably 90% or greater in the wavelength of deep ultraviolet light 18 emitted from semiconductor light-emitting element 10. Here, the transmittance of transparent member 40 increases with an increase of the transmittance of transparent member 40 per unit length, and decreases with an increase in thickness of transparent member 40. Transparent member 40 may have low light absorptance and high light transmittance to deep ultraviolet light 18 that has a wavelength of 190 nm or greater and 350 nm or less, preferably 200 nm or greater and 320 nm or less, and more preferably 220 nm or greater and 300 nm or less. Transparent member 40 may be composed of a material having a transmittance of 80% or greater, preferably 90% or greater, and more preferably 95% or greater, per path length of 100 μm in the wavelength of deep ultraviolet light 18 emitted from semiconductor light-emitting element 10.

Transparent member 40 may be open to one side, and has a concave shape having an open space therein. Transparent member 40 may be a cap. In the present specification, the cap refers to having a shape of a shell that is open to one side and has an open space therein. In the present embodiment, transparent member 40, which is a cap, may have a shape of a semi-sphere shell that is open to one side and has an open space therein. Configuring transparent member 40 in a cap shaped in a semi-sphere shell can make the angle of incidence of deep ultraviolet light 18, emitted from semiconductor light-emitting element 10 onto transparent member 40, close to perpendicular to transparent member 40.

Transparent member 40 may be composed of an inorganic compound, such as synthetic quartz, quartz glass, alkali-free glass, sapphire, fluorite (CaF), and a resin. Table 1 shows an example of transmittance of some of the materials, which can be used for transparent member 40, per path length (thickness) of 100 μm in the wavelength of 265 nm.

TABLE 1

| | Transmittance (%) per 100 μm 265 nm |
|---|---|
| Synthetic quartz | greater than 99 |
| Natural quartz | greater than 99 |
| Fluorite | greater than 99 |
| Sapphire | 99 |
| Alkali-free glass | 98 |
| Amorphous fluororesin | 100 |
| Methyl-based silicone resin | 99 |

Examples of the resin that can be used for transparent member 40 can include a silicone resin having no aromatic ring, an amorphous fluorine-containing resin, an polyimide, an epoxy resin, an acrylic resin such as a polyolefin and a polymethyl methacrylate, a polycarbonate, a polyester, a polyurethane, a polysulfone resin, a polysilane, a polyvinyl ether, and a resin having an inorganic compound added thereto. Examples of the silicone resin having no aromatic ring can include JCR6122 (manufactured by Dow Corning Toray Co., Ltd.), JCR6140 (manufactured by Dow Corning Toray Co., Ltd.), HE59 (manufactured by Nihon Yamamura Glass Co., Ltd.), HE60 (manufactured by Nihon Yamamura Glass Co., Ltd.), HE61 (manufactured by Nihon Yamamura Glass Co., Ltd.), and KER2910 (manufactured by Shin-Etsu Chemical Co., Ltd.) which are polydimethylsiloxane, and FER7061 (manufactured by Shin-Etsu Chemical Co., Ltd.) which is fluorine-containing organopolysiloxane. Examples of the amorphous fluorine-containing resin can include a perfluoro (4-vinyloxy-1-butene) polymer (CYTOP (registered trademark), manufactured by Asahi Glass Co., Ltd.), and a 2,2-bistrifluoromethyl-4,5-difluoro-1,3-dioxole polymer (Teflon (registered trademark) AF, manufactured by DuPont).

Preferably, the polyimide is a polyimide whose aromatic compound is substituted by an alicyclic compound. Examples of the alicyclic polyimide can include alicyclic acid dianhydride and the reaction product of alicyclic diamine Examples of the alicyclic acid dianhydride can include bicyclo[2.2.1]hepta-2-endo,3-endo,5-exo,6-exo-tetracarboxylic acid-2,3:5,6-dianhydride, bicyclo[2.2.1]hepta-2-exo,3-exo,5-exo,6-exo-tetracarboxylic acid-2,3:5,6-dianhydride, bicyclo[2.2.2]octa-2-endo,3-endo,5-exo,6-exo-tetracarboxylic acid 2,3:5,6-dianhydride, bicyclo[2.2.2]octa-2-exo,3-exo,5-exo,6-exo-tetracarboxylic acid 2,3:5,6-dianhydride, (4arH,8acH)-decahydro-1t,4t:5c,8c-dimethanonaphthalene 2c,3c,6c,7c-tetracarboxylic acid-2,3:6,7-dianhydride. Examples of the alicyclic diamine can include bis(aminomethylbicyclo[2.2.1] heptane.

Preferably, the epoxy resin is an epoxy resin whose aromatic ring is replaced with an alicyclic compound. Examples of the epoxy resin whose aromatic ring is replaced with an alicyclic compound can include 3',4'-epoxycyclohexylmethyl 3,4-epoxycyclohexanecarboxylate (celloxide 2021P, manufactured by Daicel Corporation), ε-Caprolactone-modified 3',4'-epoxycyclohexylmethyl 3,4-epoxycyclohexanecarboxylate (celloxide 2081, manufactured by Daicel Corporation), and 1,2-epoxy-4-vinylcyclohexane (celloxide 2000, manufactured by Daicel Corporation).

Examples of the polyolefin can include linear olefin polymers such as polyethylene, polypropylene, and methylpentene, a cyclic olefin polymer such as norbornene, TPX (manufactured by Mitsui Chemicals, Inc.), APEL (manufactured by Mitsui Chemicals, Inc.), ARTON (manufactured by JSR Corporation), ZEONOR (manufactured by Nippon Zeon Co., Ltd.), ZEONEX (manufactured by Nippon Zeon Co., Ltd.), and TOPAS (manufactured by Polyplastics Co., Ltd.).

Examples of the resin having an inorganic compound added thereto can include the above resin having an inorganic compound added thereto, such as magnesium oxide, zirconium oxide, hafnium oxide, α-aluminum oxide, γ-aluminum oxide, aluminum nitride, calcium fluoride, lutetium aluminum garnet, silicon dioxide, magnesium aluminate, sapphire, and diamond.

Liquid 50 fills the interior space of the package (30, 40) to seal semiconductor light-emitting element 10. Specifically, liquid 50 fills a space between base 30 and transparent member 40 to seal semiconductor light-emitting element 10. Liquid 50 may seal at least the light-emitting surface (a second surface 11b of substrate 11) of semiconductor light-emitting element 10.

Liquid 50 is transparent to deep ultraviolet light 18 emitted from semiconductor light-emitting element 10. In the present specification, liquid 50 being transparent to deep ultraviolet light 18 emitted from semiconductor light-emitting element 10 means that liquid 50 has a transmittance of 60% or greater in the wavelength of deep ultraviolet light 18 emitted from semiconductor light-emitting element 10. Liquid 50 may have a transmittance of preferably 75% or greater, and more preferably 90% or greater in the wavelength of deep ultraviolet light 18 emitted from semiconductor light-emitting element 10. Here, the transmittance of liquid 50 increases with an increase in transmittance of liquid 50 per unit length, and decreases with an increase in thickness of the liquid 50. Liquid 50 has low light absorptance and high light transmittance to deep ultraviolet light 18 that has a wavelength of 190 nm or greater and 350 nm or less, preferably 200 nm or greater and 320 nm or less, and more preferably 220 nm or greater and 300 nm or less. Liquid 50 may be composed of a material having a transmittance of 80% or greater, preferably 90% or greater, and more preferably 95% or greater per path length (thickness) of 100 μm in the wavelength of deep ultraviolet light 18 emitted from semiconductor light-emitting element 10.

Liquid 50 may be any of the pure water, a liquid organic compound, a salt solution, and fine particle dispersion. Table 2 through Table 10 show examples of transmittances of some of materials, which can be used for liquid 50, per path length (thickness) of 100 μm in the wavelength of 193 nm, 248 nm, 265 nm, or 300 nm, and examples of the index of refraction of the materials in the wavelength of 193 nm, 248 nm, 265 nm, or 300 nm.

Table 2 shows transmittances of the pure water per path length (thickness) of 100 μm in the wavelengths of 193 nm, 248 nm, and 265 nm, and indices of refraction of pure water in the wavelengths of 193 nm, 248 nm, and 265 nm.

TABLE 2

| | Transmittance (%) per 100 μm | | | Index of refraction | | |
|---|---|---|---|---|---|---|
| | 193 nm | 248 nm | 265 nm | 193 nm | 248 nm | 265 nm |
| Pure water | 100 | 100 | 100 | 1.44 | 1.38 | 1.37 |

The liquid organic compound may by any of a saturated hydrocarbon compound, an organic solvent having no aromatic ring, an organic halide, a silicone resin, and silicone oil. Table 3 through Table 6 show examples of transmittances of some of liquid organic compounds, which can be used for liquid 50, per path length (thickness) of 100 μm in the wavelength of 193 nm, 248 nm, or 265 nm, and examples of indices of refraction of the materials in the wavelength of 193 nm, 248 nm, or 265 nm.

Table 3 shows transmittances of some of saturated hydrocarbon compounds, which can be used for liquid 50, per path length (thickness) of 100 μm in the wavelength of 193 nm or 265 nm, and indices of refraction of the materials in the wavelength of 193 nm or 265 nm.

TABLE 3

| | | Transmittance (%) per 100 μm | | Index of refraction | |
|---|---|---|---|---|---|
| | | 193 nm | 265 nm | 193 nm | 265 nm |
| 2,2-dimethylbutane | | 99 | — | 1.481 | — |
| 2-methylpentane | | 100 | — | 1.495 | — |
| n-hexane | | 100 | — | 1.493 | — |
| n-decane | | 100 | — | 1.549 | — |
| n-dodecane | | 99 | — | 1.564 | — |
| n-hexadecane | | 99 | — | 1.581 | — |
| Cyclohexane | | 100 | — | 1.571 | — |
| Cyclooctane | | 100 | — | 1.615 | — |
| Cyclodecane | | 100 | — | 1.621 | — |
| Octahydroindene | | 98 | — | — | — |
| 2-ethylnorbornene | | 100 | — | 1.615 | — |
| 1,1'-bicyclohexyl | | 100 | 100 | 1.634 | 1.54 |
| trans-decahydronaphthalene | | 99 | — | 1.643 | 1.53 |
| cis-decahydronaphthalene | | 98 | — | 1.656 | — |
| exo-tetrahydrodicyclopentadiene | | 99 | — | 1.66 | 1.55 |
| Tricyclo[6.2.1.0$^{2,7}$]undecane | | 96 | — | 1.664 | — |
| Perhydrofluorene | | — | — | 1.668 | — |
| 3-methyltetracyclo[4.4.0.1$^{2,5}$.1$^{7,10}$]dodecane | | — | — | 1.687 | — |
| Perhydropyrene | | — | — | 1.701 | — |
| Manufactured by Du Pont | IF131 | 100 | — | 1.639 | — |
| | IF132 | 100 | — | 1.644 | — |
| | IF138 | 100 | — | 1.610 | — |
| | IF169 | 100 | — | 1.655 | — |
| Manufactured by JSR Corporation | HIL-001 | 100 | — | 1.64 | — |
| | HIL-002 | 100 | — | 1.65 | — |
| | HIL-203 | 100 | — | 1.64 | — |
| | HIL-204 | 100 | — | 1.65 | — |
| Manufactured by Mitsui Chemicals, Inc. | Delphi | 100 | 100 | 1.635 | 1.52 |
| | Babylon | 100 | — | 1.642 | — |

Examples of the saturated hydrocarbon compound can include a chain saturated hydrocarbon compound and a cyclic saturated hydrocarbon compound. Examples of the chain saturated hydrocarbon compound can include n-pentane, n-hexane, n-heptane, n-octane, n-nonane, n-decane, n-undecane, n-dodecan, n-tridecane, n-tetradecane, n-pentadecane, n-hexadecane, n-heptadecane, n-octadecane, 2,2-dimethylbutane, and 2-methylpentane. Examples of the cyclic saturated hydrocarbon compound can include cyclopentane, cyclohexane, cycloheptane, cyclooctane, cyclononane, cyclodecane, methylcyclohexane, ethyl cyclohexane, propylcyclohexane, butylcyclohexane, methylcubane, methyldinorbornene, octahydroindene, 2-ethylnorbornene, 1,1'-bicyclohexyl, trans-decahydronaphthalene, cis-decahydronaphthalene, exo-tetrahydrodicyclopentadiene, tricyclo[6.2.1.0$^{2,7}$]undecane, perhydrofluorene, 3-methyltetracyclo[4.4.0.1$^{2,5}$.1$^{7,10}$]dodecane, 1,3-dimethyladamantane, perhydrophenanthrene, and perhydropyrene. Examples of the saturated hydrocarbon compound can further include IF131 (manufactured by DuPont), IF132 (manufactured by DuPont), IF138 (manufactured by DuPont), IF169 (manufactured by DuPont), HIL-001 (manufactured by JSR Corporation), HIL-002 (manufactured by JSR Corporation), HIL-203 (manufactured by JSR Corporation), HIL-204 (manufactured by JSR Corporation), Delphi (manufactured by Mitsui Chemicals, Inc.), and Babylon (manufactured by Mitsui Chemicals, Inc.).

Table 4 shows transmittances of some of organic solvents having no aromatic ring, which can be used for liquid 50, per path length (thickness) of 100 μm in the wavelength of 193 nm, 248 nm, or 265 nm, and indices of refraction of the organic solvents in the wavelength of 193 nm, 248 nm, or 265 nm.

TABLE 4

| | Transmittance (%) per 100 μm | | | Index of refraction | | |
|---|---|---|---|---|---|---|
| | 193 nm | 248 nm | 265 nm | 193 nm | 248 nm | 265 nm |
| Isopropanol | 96 | 100 | 100 | 1.4968 | 1.4306 | — |
| Isobutanol | 85 | 100 | — | 1.5209 | 1.4508 | — |
| Glycerol | 59 | 99 | — | 1.6154 | 1.5374 | — |
| Dimethyl sulfoxide | — | 86 | — | — | 1.5961 | — |
| N-methylpyrrolidone | — | — | 99 | — | — | 1.53 |

Examples of the organic solvent having no aromatic ring can include a compound having a hydroxyl group, a compound having a carbonyl group, a compound having a sulfinyl group, a compound having an ether bond, a compound having a nitrile group, a compound having an amino group, and a sulfur-containing compound. Examples of the compound having a hydroxyl group can include isopropanol, isobutanol, glycerol, methanol, ethanol, propanol, and butanol. Examples of the compound having a carbonyl group can include N-methylpyrrolidone, N,N-dimethylformamide, acetone, methyl ethyl ketone, diethyl ketone, cyclohexanone, cyclopentanone, methyl methacrylate, methyl acrylate, and n-butyl acrylate. Examples of the compound having a sulfinyl group can include dimethyl sulfoxide. Examples of the compound having an ether bond can include tetrahydrofuran, and 1,8-cineole. Examples of the compound having a nitrile group can include acetonitrile. Examples of the compound having an amino group can include triethylamine and formamide Examples of the sulfur-containing compound can include carbon disulfide.

Table 5 shows transmittances of some of organic halides, which can be used for liquid 50, per path length (thickness) of 100 μm in the wavelength of 265 nm, and indices refraction of the organic halides in the wavelength of 265 nm.

TABLE 5

| | Transmittance (%) per 100 μm 265 nm | Index of refraction 265 nm |
|---|---|---|
| Dichloromethane | 100 | — |
| Perfluoro(4-vinyloxy-1-butene) polymer (CYTOP) solution | 100 | 1.32 |

Examples of the organic halide can include a fluorine compound, a chlorine compound, a bromine compound, and an iodine compound. Examples of the fluorine compound can include a perfluoro(4-vinyloxy-1-butene) polymer (CYTOP) (registered trademark), and a 2,2-bistrifluoromethyl-4,5-difluoro-1,3-dioxole polymer (Teflon (registered trademark) AF, manufactured by DuPont). Examples of the chlorine compound can include dichloromethane, dichloroethane, trichloroethane, tetrachloroethane, pentachloroethane, chloropropane, dichloropropane, trichloropropane, tetrachloropropane, pentachloropropane, hexachloropropane, chlorohexanol, trichloroacetyl chloride, carbon tetrachloride, chloroacetone, 1-chlorobutane, chlorocyclohexane, chloroform, chloroethanol, chlorohexane, chlorohexanone, and epichlorohydrin. Examples of the bromine compound can include bromoethane, bromoethanol, dibromomethane, dibromoethane, dibromopropane, bromoform, tribromoethane, tribromopropane, tetrabromoethane, and 1-bromopropane. Examples of the iodine compound can include methyl iodide, ethyl iodide, propyl iodide, diiodomethane, and diiodopropane.

Table 6 shows transmittances of some of silicone resins and silicone oils, which can be used for liquid 50, per path length (thickness) of 100 μm in the wavelength of 265 nm, and indices of refraction of the silicone resins and silicone oils in the wavelength of 265 nm.

TABLE 6

|  |  | Transmittance (%) per 100 μm 265 nm | Index of refraction 265 nm |
|---|---|---|---|
| Manufactured by Dow Corning Toray Co., Ltd. | JCR6122 | 100 | 1.46 |
|  | JCR6140 | 93 | — |
| Manufactured by Shin-Etsu Chemical Co., Ltd. | KER2910 | 97 | — |
|  | FER7061 | 96 | — |
| Manufactured by Nihon Yamamura Glass Co., Ltd. | HE61 | 97 | — |

The silicone resin or silicone oil has organopolysiloxane as a main chain, and an organic group is bonded to a Si atom. Examples of the organic group can include a functional group including one or more of: a functional group containing a carbon atom; a functional group containing a fluorine atom; a functional group containing a chlorine atom; a functional group containing a bromine atom; a functional group containing an iodine atom; a functional group containing a nitrogen atom; a functional group containing an oxygen atom; and a functional group containing a sulfur atom. Examples of the functional group containing a carbon atom can include a methyl group, an ethyl group, and a propyl group. Examples of the functional group containing a fluorine atom can include a trifluoromethyl group, a trifluoroethyl group, and a trifluoropropyl group. Examples of the functional group containing a chlorine atom can include a trichloromethyl group, a trichloroethyl group, and a trichloropropyl group. Examples of the functional group containing a bromine atom can include a tribromomethyl group, a tribromoethyl group, and a tribromopropyl group. Examples of the functional group containing an iodine atom include a triiodomethyl group, a triiodoethyl group, and a triiodopropyl group. Examples of the functional group containing a nitrogen atom can include an amino group, a nitrile group, an isocyanate group, and an ureido group. Examples of the functional group containing an oxygen atom can include an epoxy group, a methacrylic group, and an ether group. Examples of the functional group containing a sulfur atom can include a mercapto group, and a sulfinyl group. Examples of the silicone resin or silicone oil can further include JCR6122 (manufactured by Dow Corning Toray Co., Ltd.), JCR6140 (manufactured by Dow Corning Toray Co., Ltd.), HE59 (manufactured by Nihon Yamamura Glass Co., Ltd.), HE60 (manufactured by Nihon Yamamura Glass Co., Ltd.), HE61 (manufactured by Nihon Yamamura Glass Co., Ltd.), KER2910 (manufactured by Shin-Etsu Chemical Co., Ltd.), and FER7061 (manufactured by Shin-Etsu Chemical Co., Ltd.). Among these materials, some can be cured by being irradiated with light other than the deep ultraviolet light or by being heated. In the present embodiment, however, these materials in liquid state, without being cured, are used as liquid 50.

The salt solution may be any of an acid solution, a mineral salt solution, and an organic salt solution. Table 7 through Table 9 show examples of transmittances of some of salt solutions, which can be used for liquid 50, per path length (thickness) of 100 μm in the wavelength of 193 nm or 248 nm and examples of indices of refraction of the salt solutions in the wavelength of 193 nm or 248 nm.

Table 7 shows transmittances of some of acid solutions, which can be used for liquid 50, per path length (thickness) of 100 μm in the wavelength of 193 nm or 248 nm and indices of refraction of the acid solutions in the wavelength of 193 nm or 248 nm.

TABLE 7

|  |  | Transmittance (%) per 100 μm | | | | Index of refraction | | | |
|---|---|---|---|---|---|---|---|---|---|
|  |  | 193 nm | | 248 nm | | 193 nm | | 248 nm | |
|  | Solvent | Concentration | Transmittance (%) | Concentration | Transmittance (%) | Concentration | Index of refraction | Concentration | Index of refraction |
| Hydrochloric acid | Water | 20 wt % | — | 20 wt % | 100 | 37 wt % | 1.583 | 37 wt % | 1.487 |
| Sulfuric acid | Water | 20 wt % | 94 | 20 wt % | 100 | 20 wt % | 1.472 | 20 wt % | 1.418 |
| Phosphoric acid | Water | 85 wt % | 98 | 85 wt % | 100 | 85 wt % | 1.538 | 85 wt % | 1.488 |

Examples of the acids can include phosphoric acid, sulfuric acid, hydrochloric acid, hydrobromic acid, nitric acid, citric acid, methanesulfonic acid, methacrylic acid, butyric acid, isobutyric acid, caproic acid, caprylic acid, lauric acid, palmitic acid, stearic acid, and oleic acid.

Table 8 shows transmittances of some of mineral salt solutions, which can be used for liquid 50, per path length (thickness) of 100 μm in the wavelength of 193 nm, and indices of refraction of the mineral salt solutions in the wavelength of 193 nm.

TABLE 8

|  |  | Transmittance (%) per 100 μm in 193 nm | | Index of refraction in 193 nm | |
|---|---|---|---|---|---|
|  | Solvent | Concentration | Transmittance (%) | Concentration | Index of refraction |
| Sodium bromide | Water | 0.1 mM | 97 | 2M | 1.5353 |
| Lithium bromide | Water | 0.1 mM | 97 | 2M | 1.5205 |
| Potassium bromide | Water | 0.1 mM | 97 | 2M | 1.5275 |

TABLE 8-continued

| | | Transmittance (%) per 100 μm in 193 nm | | Index of refraction in 193 nm | |
|---|---|---|---|---|---|
| | Solvent | Concentration | Transmittance (%) | Concentration | Index of refraction |
| Rubidium bromide | Water | 0.1 mM | 97 | 2M | 1.5365 |
| Cesium bromide | Water | 0.1 mM | 97 | 2M | 1.5328 |
| Ammonium bromide | Water | 0.1 mM | 97 | 2M | 1.5355 |
| Sodium thiocyanate | Water | 0.1 mM | 97 | 2M | 1.5531 |
| Sodium thiosulfate | Water | 0.1 mM | 98 | 2M | 1.5299 |
| Sodium sulfite | Water | 0.1 mM | 99 | 2M | 1.5241 |
| Rubidium acetate | Water | 1 mM | 98 | 2M | 1.5083 |
| Cesium acetate | Water | 1 mM | 98 | 2M | 1.5164 |

Examples of the mineral salt can include sodium chloride, potassium chloride, cesium chloride, ammonium chloride, calcium chloride, lithium chloride, rubidium chloride, tetramethylammonium chloride, aluminum chloride 6-hydrate, sodium bromide, zinc bromide, lithium bromide, potassium bromide, rubidium bromide, cesium bromide, ammonium bromide, lithium sulfate, sodium sulfate, potassium sulfate, rubidium sulfate, cesium sulfate, magnesium sulfate, gadolinium sulfate, zinc sulfate, alum, ammonium alum, sodium hydrogen sulfate, sodium hydrogen sulfite, sodium hydrogen phosphate, sodium 2-hydrogen phosphate, potassium 2-hydrogen phosphate, sodium perchlorate, sodium thiocyanate, sodium thiosulfate, and sodium sulfite.

Table 9 shows transmittances of some of organic salt solutions, which can be used for liquid 50, per path length (thickness) of 100 μm in the wavelength of 193 nm, and indices of refraction of the organic salt solutions in the wavelength of 193 nm.

Examples of the organic salt can include lithium acetate, sodium acetate, potassium acetate, rubidium acetate, cesium acetate, tetramethylammonium acetate, tetraethylammonium acetate, tetrapropylammonium acetate, triethylammonium acetate, diethyldimethylammonium acetate, tetrabutylammonium acetate, tetramethylammonium chloride, tetramethylammonium bromide, barium methanesulfonate, lanthanum methanesulfonate, cesium methanesulfonate, cyclohexyl trimethylammonium methanesulfonate, sodium cyclohexane sulfonate, sodium cyclohexylmethanesulfonate, decahydronaphthalene-2-sodium sulfonate, 1-potassium adamantanemethanesulfonate, 1-potassium adamantanesulfonate, decyl trimethylammonium methanesulfonate, hexadecyl trimethylammonium methanesulfonate, adamantyl trimethylammonium methanesulfonate, cyclohexyl trimethylammonium methanesulfonate, methanesulfonic acid 1,1'-dimethylpiperidinium, methanesulfonic acid 1-methyl quinuclidinium, methanesulfonic acid 1,1-dimethyldecahydroquinolinium, methanesulfonic acid 1,1,4,4-tetramethylpiperazin-1,4-diium, and 1,4-dimethyl 1,4-diazoniabicyclo[2.2.2]octane.

Examples of the solvent used for the salt solution can include, but not limited to, water, an organic solvent, and a solution dissolved in the silicone resin or silicone oil. Examples of the organic solvent can include saturated hydrocarbon compound solutions such as cyclohexane, decane, and decahydronaphthalene, n-butyl acrylate, n-methyl acrylate, tetrahydrofuran, chloroform, methyl ethyl ketone, methyl methacrylate, dichloromethane, and dimethyl silicone oil.

Table 10 shows transmittances of some of fine particle dispersion, which can be used for liquid 50, per path length (thickness) of 100 μm in the wavelength of 248 nm or 300 nm, and indices of refraction of the fine particle dispersion in the wavelength of 193 nm, 248 nm, or 300 nm.

TABLE 9

| | | Transmittance (%) per 100 μm in 193 nm | | Index of refraction in 193 nm | |
|---|---|---|---|---|---|
| | Solvent | Concentration | Transmittance (%) | Concentration | Index of refraction |
| Tetrapropylammonium acetate | Water | 1 mm | 98 | 1.5 m | 1.518 |
| Tetrabutylammonium acetate | Water | 1 mm | 98 | 1.5 m | 1.533 |
| Tetramethylammonium bromide | Water | 0.1 mm | 97 | 2 m | 1.5524 |
| Lanthanum methanesulfonate | Water | 2 m | 99 | 2.82 m | 1.577 |
| Cyclohexyl trimethylammonium methanesulfonate | Water | 3.4 m | 97 | 3.4 m | 1.58 |
| Decyl trimethylammonium methanesulfonate | Water | 1 m | 97 | 1 m | 1.503 |
| Adamantyl trimethylammonium methanesulfonate | Water | 1 m | — | 1 m | 1.508 |

TABLE 10

| Fine particles | Dispersion | Concentration | Average particle size (nm) | Transmittance (%) per thickness of 100 μm | | | Index of refraction | | |
| --- | --- | --- | --- | --- | --- | --- | --- | --- | --- |
| | | | | 193 nm | 248 nm | 300 nm | 193 nm | 248 nm | 300 nm |
| Sicilia fine particles | Water | 21.6 wt % | 23 | — | 95 | — | greater than 1.35 | greater than 1.35 | greater than 1.35 |
| Surface-modified zirconia | Dimethyl silicone oil | 25 wt % | — | — | — | 98 | — | — | — |
| α-aluminum oxide | Decane | 40 vol % | 5 | — | — | — | 1.70 | — | — |
| γ-aluminum oxide | Decane | 40 vol % | 6 | — | — | — | 1.70 | — | — |
| Magnesium oxide | Decane | 40 vol % | 7 | — | — | — | 1.72 | — | — |

Examples of fine particles in the fine particle dispersion can include inorganic compounds such as magnesium oxide, zirconium oxide, hafnium oxide, α-aluminum oxide, γ-aluminum oxide, aluminum nitride, calcium fluoride, lutetium aluminum garnet, silicon dioxide (silica), magnesium aluminate, sapphire, and diamond. Like surface-modified zirconia, the surfaces of the fine particles may be modified with a different material.

Examples of the solvent for dispersing the fine particles can include, but not limited to, water, an organic solvent, and a solution dissolved in the silicone resin or silicone oil. Examples of the organic solvent can include saturated hydrocarbon compound solutions such as cyclohexane, decane, and decahydronaphthalene, n-butyl acrylate, n-methyl acrylate, tetrahydrofuran, chloroform, methyl ethyl ketone, methyl methacrylate, dichloromethane, and dimethyl silicone oil.

Liquid 50 may have an index of refraction of 1.32 or greater, preferably 1.40 or greater, and more preferably 1.45 or greater in the wavelength of deep ultraviolet light 18 emitted from semiconductor light-emitting element 10. Liquid 50 may further have an index of refraction of preferably 1.50 or greater, and more preferably 1.55 or greater. Since liquid 50 has the index of refraction of 1.32 or greater in the wavelength of deep ultraviolet light 18 emitted from semiconductor light-emitting element 10, the index of refraction of liquid 50 in the wavelength of deep ultraviolet light 18 emitted from semiconductor light-emitting element 10 can be made closer to the index of refraction (index of refraction of substrate 11) of the light-emitting surface (second surface 11b) of semiconductor light-emitting element 10 in the wavelength of deep ultraviolet light 18.

In the wavelength of deep ultraviolet light 18 emitted from semiconductor light-emitting element 10, liquid 50 may have an index of refraction smaller than the light-emitting surface (second surface 11b) of semiconductor light-emitting element 10 and greater than transparent member 40. For that reason, the reflectivity at the interface between the light-emitting surface (second surface 11b) of semiconductor light-emitting element 10 and liquid 50, and the reflectivity at the interface between liquid 50 and transparent member 40 can be lowered.

Preferably, liquid 50 is insulative. In the present embodiment, liquid 50 is in contact with n-type electrode 15, p-type electrode 16, first conductive pad 21, second conductive pad 22, bond member 25, lead pin 31, and conductive wire 33.

Liquid 50 being insulative can prevent n-type electrode 15 and p-type electrode 16 from being short-circuited. If liquid 50 is electrically conductive, a thin, insulating film may be provided on the surface of semiconductor light-emitting element 10, the surface of first conductive pad 21, the surface of second conductive pad 22, the surface of bond member 25, the surface of lead pin 31, and the surface of conductive wire 33.

Semiconductor light-emitting element 10 includes substrate 11, n-type semiconductor layer 12, active layer 13, p-type semiconductor layer 14, n-type electrode 15, and p-type electrode 16.

Substrate 11 has a first surface 11a and second surface 11b opposite the first surface 11a. Second surface 11b may be a light-emitting surface. Preferably, substrate 11 has a high transmittance, such as 50% or greater, in the wavelength of deep ultraviolet light 18 emitted by semiconductor light-emitting element 10. Examples of the material of substrate 11 can include aluminum nitride (AlN), silicon carbide (SiC), sapphire, gallium nitride (GaN), gallium oxide ($Ga_2O_3$), and silicon (Si). As substrate 11, a template substrate may be used in which an underlying layer composed of, for example, aluminum nitride (AlN) or aluminum nitride gallium (AlGaN) is formed on a substrate composed of, for example, sapphire or SiC.

N-type semiconductor layer 12 is provided on first surface 11a of substrate 11. N-type semiconductor layer 12 may be composed of a nitride semiconductor made of AlInGaN. More specifically, n-type semiconductor layer 12 may be composed of $Al_{x_1}In_{y_1}Ga_{z_1}N$, where $x_1$, $y_1$, and $z_1$ are rational numbers satisfying $0 \leq x_1 \leq 1.0$, $0 \leq y_1 \leq 0.1$, and $0 \leq z_1 \leq 1.0$, and $x_1+y_1+z_1=1.0$. Preferably, n-type semiconductor layer 12 contains n-type impurities such as silicon (Si), germanium (Ge), tin (Sn), oxygen (O), or carbon (C). The concentration of the n-type impurities in n-type semiconductor layer 12 may be $1.0 \times 10^{17}$ $cm^{-3}$ or greater and $1.0 \times 10^{20}$ $cm^{-3}$ or less, and preferably $1.0 \times 10^{18}$ $cm^{-3}$ or greater and $1.0 \times 10^{19}$ $cm^{-3}$ or less. N-type semiconductor layer 12 may have a thickness of 100 to 10000 nm, and preferably 500 to 3000 nm.

In order to confine electrons and holes in active layer 13 by n-type semiconductor layer 12, and reduce absorption of deep ultraviolet light 18, emitted from active layer 13, into a first p-type semiconductor layer 14a, preferably, n-type semiconductor layer 12 has bandgap energy greater than the energy of deep ultraviolet light 18 emitted from active layer 13. N-type semiconductor layer 12 may have an index of refraction lower than active layer 13, and serve as a clad layer. N-type semiconductor layer 12 may be a monolayer or may be a multi-layer including layers having different Al compositions, In compositions, or Ga compositions. The multi-layer comprising layers having different Al compositions, In compositions, or Ga compositions may have a superlattice structure, or a graded composition structure in which the compositions gradually vary.

Active layer 13 is provided on n-type semiconductor layer 12. Active layer 13 is configured such that deep ultraviolet light 18 having a wavelength of 190 to 350 nm, preferably 200 to 320 nm, and more preferably 220 to 300 nm is emitted from active layer 13. Deep ultraviolet light 18 emitted from semiconductor light-emitting element 10 has a wavelength of 190 to 350 nm, preferably 200 to 320 nm, and more preferably 220 to 300 nm.

Active layer 13 may be composed of a nitride semiconductor made of AlInGaN. More specifically, active layer 13 may have a MQW (Multiple Quantum Well) structure that includes: a well layer composed of $Al_{x2}In_{y2}Ga_{z2}$, where $x_2$, $y_2$, and $z_2$ are rational numbers satisfying $0 \leq x_2 \leq 1.0$, $0 \leq y_2 \leq 0.1$, and $0 \leq z_2 \leq 1.0$, and $x_2+y_2+z_2=1.0$; and a barrier layer composed of $Al_{x3}In_{y3}Ga_{z3}N$, where $x_3$, $y_3$, and $z_3$ are rational numbers satisfying $0 \leq x_3 \leq 1.0$, $0 \leq y_3 \leq 0.1$, and $0 \leq z_3 \leq 1.0$, and $x_3+y_3+z_3=1.0$, the barrier layer having bandgap energy greater than the well layer. In order to confine electrons and holes in active layer 13 by n-type semiconductor layer 12 and p-type semiconductor layer 14, preferably, active layer 13 has bandgap energy smaller than n-type semiconductor layer 12 and p-type semiconductor layer 14. Active layer 13 may have an index of refraction higher than n-type semiconductor layer 12 and p-type semiconductor layer 14.

P-type semiconductor layer 14 is provided on active layer 13. P-type semiconductor layer may be composed of first p-type semiconductor layer 14a on the active layer 13 side, and a second p-type semiconductor layer 14b on the side opposite the active layer 13.

First p-type semiconductor layer 14a may be composed of a nitride semiconductor made of AlInGaN. More specifically, first p-type semiconductor layer 14a may be composed of $Al_{x4}In_{y4}Ga_{z4}N$, where $x_4$, $y_4$, and $z_4$ are rational numbers satisfying $0 \leq x_4 \leq 1.0$, $0 \leq y_4 \leq 0.1$, and $0 \leq z_4 \leq 1.0$, and $x_4+y_4+z_4=1.0$. Preferably, first p-type semiconductor layer 14a contains p-type impurities such as magnesium (Mg), zinc (Zn), or beryllium (Be). The concentration of the p-type impurities in first p-type semiconductor layer 14a may be $1.0 \times 10^{17}$ cm$^{-3}$ or greater, and preferably $1.0 \times 10^{18}$ cm$^{-3}$ or greater. First p-type semiconductor layer 14a may have a thickness of 5 to 1000 nm, and preferably 10 to 500 nm or less.

In order to confine electrons and holes in active layer 13 by first p-type semiconductor layer 14a, and reduce absorption of deep ultraviolet light 18, emitted from active layer 13, into first p-type semiconductor layer 14a, first p-type semiconductor layer 14a may have bandgap energy greater than the energy of deep ultraviolet light 18 emitted from active layer 13. In order to uniformly inject holes by active layer 13 from first p-type semiconductor layer 14a, first p-type semiconductor layer 14a may have a small Al composition ratio. First p-type semiconductor layer 14a may have an index of refraction lower than active layer 13 and serve as a clad layer. First p-type semiconductor layer 14a may be a monolayer or may be a multi-layer including layers having different Al compositions, In compositions, or Ga compositions. The multi-layer including layers having different Al compositions, In compositions, or Ga compositions may have a superlattice structure, or a graded composition structure in which the compositions gradually vary.

Second p-type semiconductor layer 14b may be composed of a nitride semiconductor made of AlInGaN. More specifically, second p-type semiconductor layer 14b may be composed of $Al_{x5}In_{y5}Ga_{z5}N$, where $x_5$, $y_5$, and $z_5$ are rational numbers satisfying $0 \leq x_5 \leq 1.0$, $0 \leq y_5 \leq 0.1$, and $0 \leq z_5 \leq 1.0$, and $x_5+y_5+z_5=1.0$. Preferably, second p-type semiconductor layer 14b contains p-type impurities such as magnesium (Mg), zinc (Zn), or beryllium (Be). Second p-type semiconductor layer 14b may have p-type conductivity higher than first p-type semiconductor layer 14a, and serve as a p-type contact layer. The concentration of the p-type impurities in second p-type semiconductor layer 14b may be $1.0 \times 10^{17}$ cm$^{-3}$ or greater, and preferably $1.0 \times 10^{18}$ cm$^{-3}$ or greater. In order to reduce absorption of deep ultraviolet light 18, emitted from active layer 13, into second p-type semiconductor layer 14b and obtain good p-type contact in second p-type semiconductor layer 14b, second p-type semiconductor layer 14b may have a thickness of 1 to 500 nm.

When first p-type semiconductor layer 14a and second p-type semiconductor layer 14b are composed of nitride semiconductors, the smaller the Al compositions of the nitride semiconductors and the smaller the bandgap of the semiconductor layers, the more uniformly the holes are injected by active layer 13 from second p-type semiconductor layer 14b, thereby yielding good p-type contact properties. For that reason, second p-type semiconductor layer 14b may have a small Al composition ratio. In order to reduce absorption of deep ultraviolet light 18, emitted from active layer 13, into second p-type semiconductor layer 14b, second p-type semiconductor layer 14b may have bandgap energy greater than the energy of deep ultraviolet light 18 emitted from active layer 13.

N-type electrode 15 is provided on an exposed surface of n-type semiconductor layer 12. The exposed surface of n-type semiconductor layer 12 refers to a surface where n-type semiconductor layer 12 is exposed by: stacking, on substrate 11, n-type semiconductor layer 12, active layer 13, and p-type semiconductor layer 14; removing a portion of n-type semiconductor layer 12; and partially removing active layer 13 and p-type semiconductor layer 14. P-type electrode 16 is provided on a surface of p-type semiconductor layer 14, more specifically, on a surface of second p-type semiconductor layer 14b that may serve as the p-type contact layer.

Figure 2:
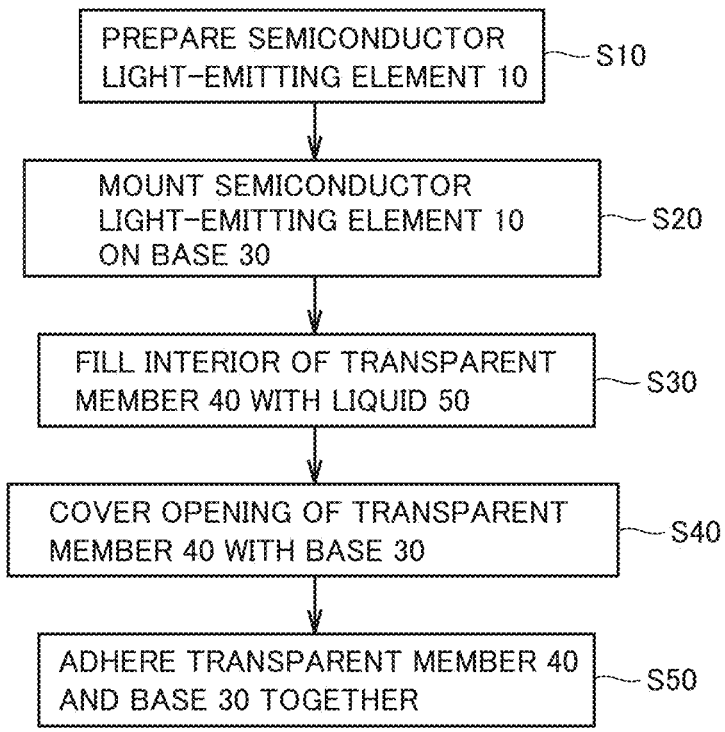
FIG. 2 includes: (A) a flowchart for a method for fabricating the light-emitting module according to Embodiment 1; and (B) a flowchart for a step of preparing a semiconductor light-emitting element included in the light-emitting module according to Embodiment 1.
Figure 2:
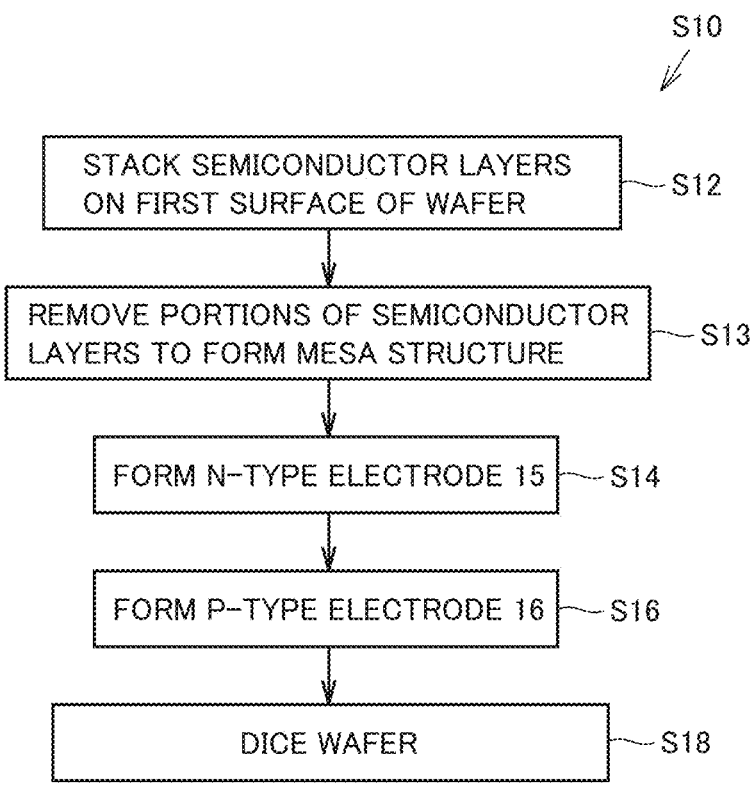
Figure 3:
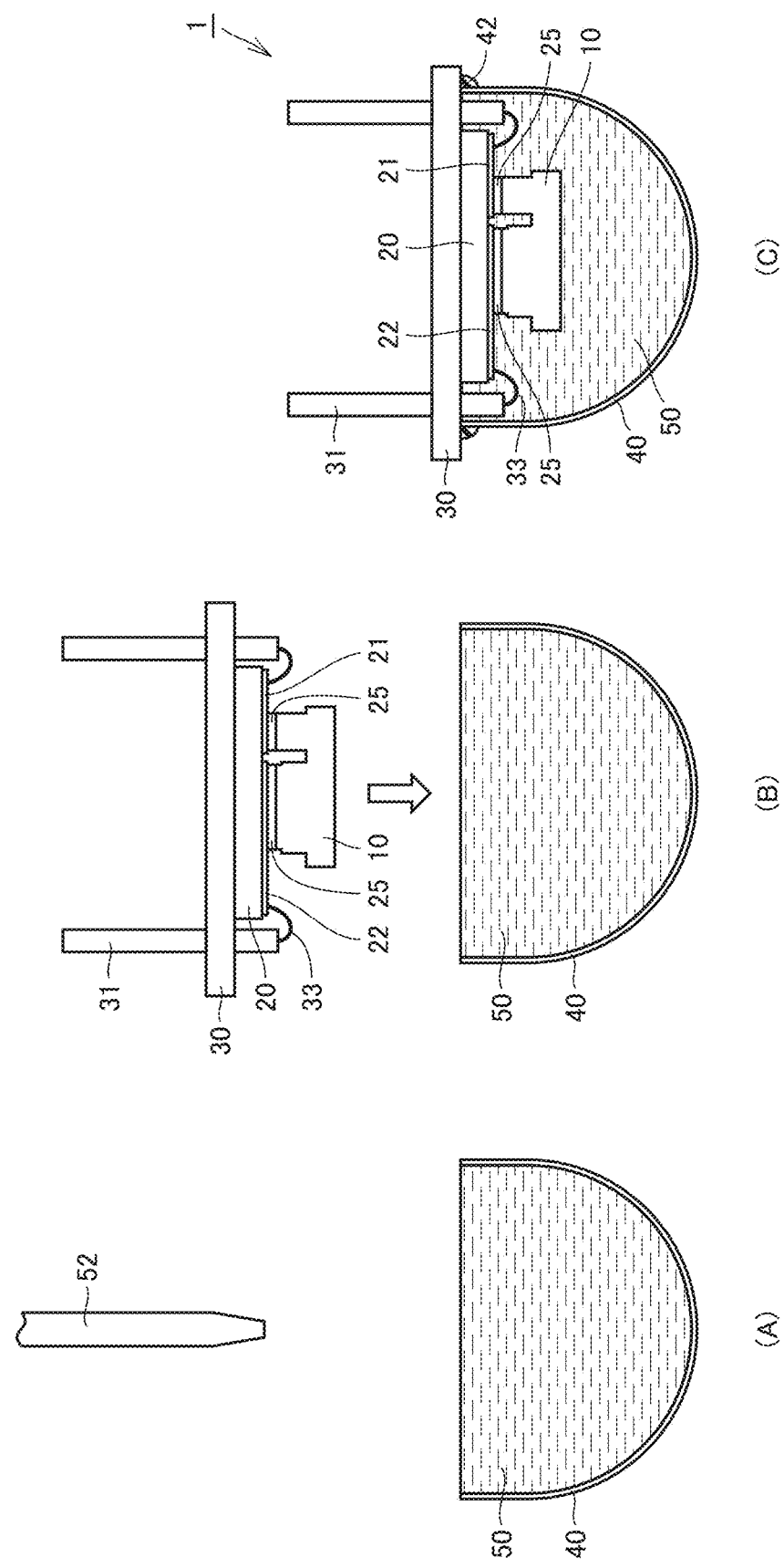
FIG. 3 includes: (A) a schematic partial sectional view illustrating a certain step in the method for fabricating the light-emitting module according to Embodiment 1; (B) a schematic partial sectional view illustrating a step following (A) in the method for fabricating the light-emitting module according to Embodiment 1; and (C) a schematic partial sectional view illustrating a step following (B) in the method for fabricating the light-emitting module according to Embodiment 1.

Referring (A) of FIG. 2 through (C) of FIG. 3, a method for fabricating light-emitting module 1 according to the present embodiment will be described. An example of the method for fabricating light-emitting module 1 according to the present embodiment may include the following steps.

Semiconductor light-emitting element 10 is prepared (S10). Semiconductor light-emitting element 10 is mounted on base 30 (S20). Referring to (A) of FIG. 3, liquid 50 is discharged through a nozzle 52 to fill the interior of transparent member 40 with liquid 50 (S30). Referring to (B) of FIG. 3, an opening of transparent member 40 is covered with base 30 having semiconductor light-emitting element 10 mounted thereon, the opening being filled with liquid 50 (S40). As a result, semiconductor light-emitting element 10 is inserted into the interior of transparent member 40 filled with liquid 50 and base 30 abuts transparent member 40. Referring to (C) of FIG. 3, transparent member 40 and base 30 are adhered together by adhesive 42 (S50).

The step of preparing semiconductor light-emitting element 10 may include the following steps. The semiconductor layers, including n-type semiconductor layer 12, active layer 13, and p-type semiconductor layer 14, are stacked on the first surface of a wafer by a method such as MOCVD (Metallorganic Chemical Vapor Deposition), MOVPE (Metallorganic Vapor Phase Epitaxy), MBE (Molecular Beam Epitaxy), or HVPE (Hydride Vapor Phase Epitaxy) (S12). The wafer becomes substrate 11 after a later dicing process, and the first surface of the wafer becomes first surface 11a of substrate 11 after the later dicing process. Portions of the semiconductor layers, including n-type semiconductor layer 12, active layer 13, and p-type semiconductor layer 14, are partially removed by, for example, etching to form a mesa structure (S13). N-type electrode 15 is formed, by vacuum deposition for example, on the exposed surface of n-type semiconductor layer 12 formed by the etching (S14). To improve the electric contact between n-type semiconductor layer 12 and n-type electrode 15, preferably, they are annealed at a temperature of 300 degrees Celsius or higher and 1100 degrees Celsius or lower for 30 seconds or longer and 3 minutes or less. Then, p-type electrode 16 is formed on p-type semiconductor layer 14 by a method such as vacuum deposition (S16). To improve the electrical contact between p-type semiconductor layer 14 and p-type electrode 16, preferably, they are annealed at a temperature of 200 degrees Celsius or higher and 800 degrees Celsius or lower for 30 seconds or longer and 3 minutes or less. Then, the wafer is diced (S18) to yield a singulated semiconductor light-emitting element 10.

Actions and effects of light-emitting module 1 according to the present embodiment are described.

The light-emitting module according to the present embodiment 1 includes: semiconductor light-emitting element 10 which emits deep ultraviolet light 18; liquid 50 sealing semiconductor light-emitting element 10; and the package (30, 40) for accommodating semiconductor light-emitting element 10 and liquid 50. Liquid 50 is transparent to deep ultraviolet light 18 emitted from semiconductor light-emitting element 10. The package (30, 40) has transparent member 40 transparent to deep ultraviolet light 18 emitted from semiconductor light-emitting element 10.

Since transparent member 40 and liquid 50 are transparent to deep ultraviolet light 18 emitted from semiconductor light-emitting element 10, transparent member 40 and liquid 50 have low light absorptances in the wavelength of deep ultraviolet light 18. For that reason, deep ultraviolet light 18 emitted from semiconductor light-emitting element 10 can be efficiently extracted out of the package (30, 40). Moreover, since transparent member 40 and liquid 50 are transparent and have low light absorptances in the wavelength of deep ultraviolet light 18, transparent member 40 and liquid 50 can be prevented from decreasing in light transmittance in the wavelength of deep ultraviolet light 18, even when transparent member 40 and liquid 50 are exposed to deep ultraviolet light 18 for a long period of time. As a result, according to light-emitting module 1 of the present embodiment, a highly reliable light-emitting module which is provided with semiconductor light-emitting element 10 that emits deep ultraviolet light 18 can be provided.

Since liquid 50 is fluid, liquid 50 is convected through the interior space of the package (30, 40) by heat generated in semiconductor light-emitting element 10. Since liquid 50 convects through the interior space of the package (30, 40), there is no certain portion of liquid 50 that remains proximate to semiconductor light-emitting element 10 whose deep ultraviolet light 18 is high in optical density. For that reason, no certain portion of liquid 50 is kept irradiated with deep ultraviolet light 18 having a high optical density emitted from semiconductor light-emitting element 10, thereby preventing liquid 50 from degradating and liquid 50 from decreasing in light transmittance in the wavelength of deep ultraviolet light 18. Moreover, since liquid 50 is located between transparent member 40 and semiconductor light-emitting element 10 which emits deep ultraviolet light 18, the optical density of deep ultraviolet light 18 in transparent member 40 is sufficiently smaller than the optical density of deep ultraviolet light 18 that is proximate to semiconductor light-emitting element 10. For that reason, even if transparent member 40, which is in a solid form, has a light absorptance to deep ultraviolet light 18 higher than liquid 50 does, the degradation of transparent member 40 by being irradiated with deep ultraviolet light 18 can be sufficiently inhibited. As a result, according to light-emitting module 1 of the present embodiment, a highly reliable light-emitting module which is provided with semiconductor light-emitting element 10 that emits deep ultraviolet light 18 can be provided.

In contrast, in Comparative Example where semiconductor light-emitting element 10 which emits deep ultraviolet light 18 is sealed with a cured resin, unlike liquid 50, the cured resin does not flow. For that reason, the cured resin located proximate to semiconductor light-emitting element 10 is kept irradiated with deep ultraviolet light 18 having a high optical density, ending up being degraded quickly. The degradation of the cured resin located proximate to semiconductor light-emitting element 10 is further facilitated due to that fact that the cured resin has a higher light absorptance to deep ultraviolet light 18 than liquid 50 does in the wavelength region of deep ultraviolet light 18. For that reason, Comparative Example where semiconductor light-emitting element 10 which emits deep ultraviolet light 18 is sealed with a cured resin cannot provide a highly reliable light-emitting module. The foregoing description is also supported by Experimental Example below.

Figure 4:
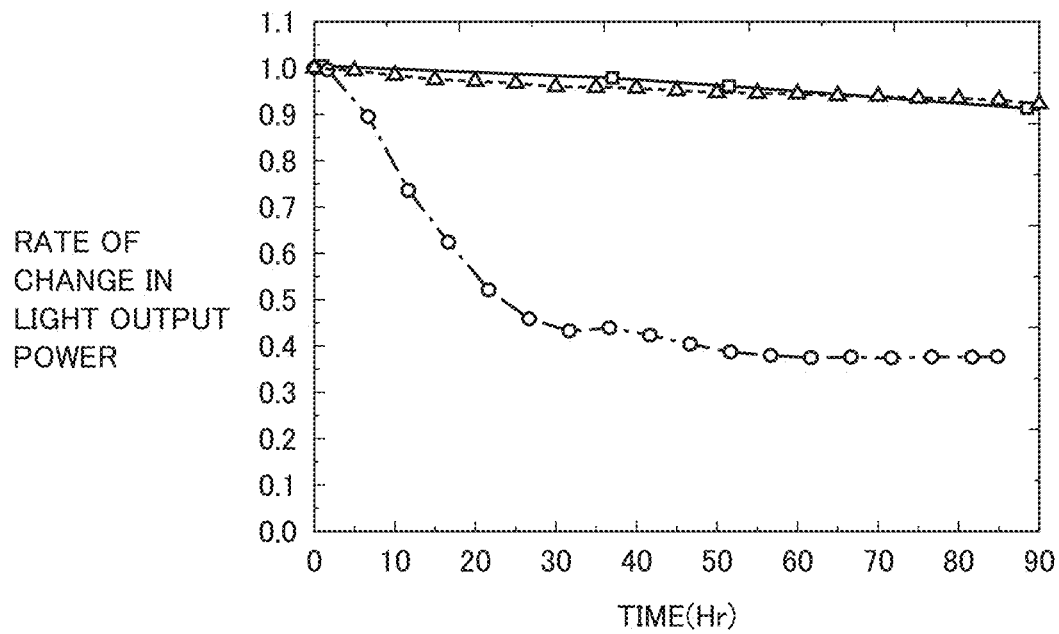
FIG. 4 includes: (A) a diagram illustrating rates of change over operating time in light output power of the light-emitting module according to Embodiment 1 and a light-emitting module according to Comparative Example; and (B) a diagram illustrating changes, on the magnitude of supply current, in light output power of the light-emitting module according to Embodiment 1 and the light-emitting module according to Comparative Example.
Figure 4:
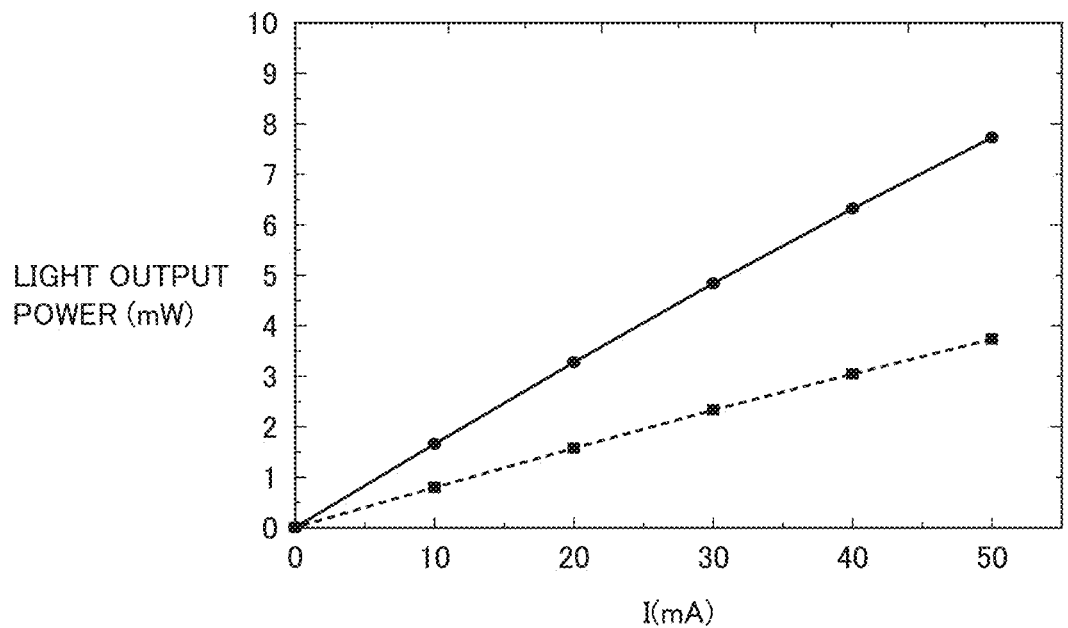

Referring to (A) of FIG. 4, the solid line indicates a rate of change over operating time in light output power of a light-emitting module 1 according to Experimental Example of the present embodiment. The dotted line indicates a rate of change over operating time in light output power of a light-emitting module according to Comparative Example 1 without liquid 50. In Comparative Example 1, the semiconductor light-emitting element is covered by air. The dash-dotted line indicates a rate of change over operating time in light output power of a light-emitting module according to Comparative Example 2 provided with a semiconductor light-emitting element 10 that emits deep ultraviolet light 18, the semiconductor light-emitting element 10 being sealed with a cured, fluoro-based silicone resin FER7061 (manufactured by Shin-Etsu Chemical Co., Ltd.), instead of liquid 50. The rate of change over operating time in light output power of the light-emitting module is defined by a value obtained by normalizing the light output from the light-emitting module after elapse of a certain period of time with the light output from the light-emitting module immediately following the operation. In light-emitting module 1 according to Experimental Example of the present embodiment, transparent member 40 is composed of synthetic quartz, and is a cap having a shape of a semi-sphere shell having a thickness of 1.5 mm In light-emitting module 1 according to Experimental Example of the present embodiment, liquid 50 is 1,1'-bicyclohexyl. In light-emitting module 1 according to Experimental Example of the present embodiment, semiconductor light-emitting element 10 is configured to have an emissive wavelength of 265 nm.

Light-emitting module 1 according to the present embodiment that is provided with semiconductor light-emitting element 10 sealed with liquid 50, has a rate of change over operating time in light output power that is similar to Comparative Example 1 where the semiconductor light-emitting element is covered by air. For that reason, it is understood that even when the operating time of light-emitting module 1 is long, liquid 50 does not degrade and the transmittance does not decrease either, as with air. Note that the changes over operating time in light output power of light-emitting module 1 according to the present embodiment is considered to be due to changes in light output power of semiconductor light-emitting element 10 itself.

In contrast, the light output power of the light-emitting module according to Comparative Example 2 that is provided with semiconductor light-emitting element 10 sealed with a cured resin, is more significantly declined as the operating time extends, than the light output power of light-emitting module 1 according to the present embodiment. It is considered that the light output power of the light-emitting module according to Comparative Example 2 is greatly declined as such because the cured resin sealing semiconductor light-emitting element 10 is degraded by deep ultraviolet light 18 emitted from semiconductor light-emitting element 10 and the transmittance of the cured resin is thus quickly decreased in the wavelength of deep ultraviolet light 18 emitted from semiconductor light-emitting element 10. According to light-emitting module 1 of the present embodiment, a highly reliable light-emitting module provided with a semiconductor light-emitting element 10 that emits deep ultraviolet light 18 can be provided, whereas the light-emitting module according to Comparative Example 2 provide with semiconductor light-emitting element 10 sealed with a cured resin cannot provide a highly reliable light-emitting module.

Referring to (B) of FIG. 4, the solid line indicates changes in light output power of light-emitting module 1 according to the present embodiment, on a current supplied to light-emitting module 1 according to Experimental Example of the present embodiment. The dotted line indicates changes in light output power of the light-emitting module 1 according to Comparative Example 1 without liquid 50, on a current supplied to the light-emitting module according to Comparative Example 1. Light-emitting module 1 according to the present embodiment has light output power twice as much as the light-emitting module 1 according to Comparative Example 1.

In light-emitting module 1 according to the present embodiment which includes liquid 50, semiconductor light-emitting element 10 is sealed with liquid 50. In general, the index of refraction of liquid 50 is greater than the index of refraction of air. The difference between the index of refraction of liquid 50 and the index of refraction of the light-emitting surface (second surface 11*b*) (the index of refraction of substrate 11) of semiconductor light-emitting element 10 in the wavelength of deep ultraviolet light 18 can be made smaller than the difference between the index of refraction of air and the index of refraction of the light-emitting surface (second surface 11*b*) (the index of refraction of substrate 11) of semiconductor light-emitting element 10 in the wavelength of deep ultraviolet light 18. For that reason, according to light-emitting module 1 of the present embodiment, deep ultraviolet light 18 emitted through active layer 13 of semiconductor light-emitting element 10 can be reduced from being totally reflected off the light-emitting surface (second surface 11*b*) of semiconductor light-emitting element 10, thereby allowing deep ultraviolet light 18, emitted from active layer 13 of semiconductor light-emitting element 10, to be efficiently extracted out of the light-emitting surface (second surface 11*b*) of semiconductor light-emitting element 10. As a result, according to light-emitting module 1 of the present embodiment, a light-emitting module having high light output power can be provided.

In contrast, the light-emitting module according to Comparative Example 1 that is provided with semiconductor light-emitting element 10 covered by air, has a great difference between the index of refraction of air and the index of refraction of the light-emitting surface (second surface 11*b*) (the index of refraction of substrate 11) of semiconductor light-emitting element 10 in the wavelength of deep ultraviolet light 18. For that reason, most of deep ultraviolet light 18 emitted from active layer 13 of semiconductor light-emitting element 10 included in the light-emitting module according to Comparative Example 1 is totally reflected off the light-emitting surface (second surface 11*b*) of semiconductor light-emitting element 10, making it hard to extract deep ultraviolet light 18, emitted from active layer 13 of semiconductor light-emitting element 10, out of semiconductor light-emitting element 10.

Furthermore, in the wavelength region of deep ultraviolet light 18, liquid 50 has an index of refraction higher than the cured resin that has a relatively high transmittance to the wavelength of deep ultraviolet light 18. For that reason, the difference between the index of refraction of liquid 50 and the index of refraction of the light-emitting surface (second surface 11*b*) (the index of refraction of substrate 11) of semiconductor light-emitting element 10 in the wavelength of deep ultraviolet light 18 can be made smaller than the difference between the index of refraction of the cured resin and the index of refraction of the light-emitting surface (second surface 11*b*) (the index of refraction of substrate 11) of semiconductor light-emitting element 10 in the wavelength of deep ultraviolet light 18. For that reason, according to light-emitting module 1 of the present embodiment that is provided with semiconductor light-emitting element 10 sealed with liquid 50, deep ultraviolet light 18 emitted from active layer 13 of semiconductor light-emitting element 10 can be reduced from being totally reflected off the light-emitting surface (second surface 11*b*) of semiconductor light-emitting element 10 and deep ultraviolet light 18 emitted from active layer 13 of semiconductor light-emitting element 10 can be efficiently extracted out of the light-emitting surface (second surface 11*b*) of semiconductor light-emitting element 10, as compared to the light-emitting module according to Comparative Example 2 that is provided with semiconductor light-emitting element 10 sealed with a cured resin. As a result, according to light-emitting module 1 of the present embodiment, a light-emitting module having a higher light output power than the light-emitting module according to Comparative Example 2 can be provided.

In light-emitting module 1 according to the present embodiment, transparent member 40 accommodates liquid 50, and transparent member 40 is in contact with liquid 50. In general, the index of refraction of liquid 50 is greater than the index of refraction of air. The difference between the index of refraction of liquid 50 and the index of refraction of transparent member 40 in the wavelength of deep ultraviolet light 18 can be made smaller than the difference between the index of refraction of air and the index of refraction of transparent member 40 in the wavelength of deep ultraviolet light 18 in Comparative Example 1. For that reason, according to light-emitting module 1 of the present embodiment, deep ultraviolet light 18 emitted from semiconductor light-emitting element 10 can be reduced from being reflected off transparent member 40, thereby allowing deep ultraviolet light 18, emitted from semiconductor light-emitting element 10, to be efficiently extracted out of light-emitting module 1. As a result, according to light-emitting module 1 of the present embodiment, a light-emitting module having high light output power can be provided.

As described above, in light-emitting module 1 according to the present embodiment, deep ultraviolet light 18 emitted from semiconductor light-emitting element 10 can be highly efficiently extracted out of light-emitting module 1. Deep ultraviolet light 18 emitted from semiconductor light-emitting element 10 can be reduced from being converted into heat within light-emitting module 1. For that reason, according to light-emitting module 1 of the present embodiment, the lifetime of semiconductor light-emitting element 10 which emits deep ultraviolet light 18 can be extended and also a highly reliable light-emitting module which is provided with semiconductor light-emitting element 10 that emits deep ultraviolet light 18 can be provided.

Since liquid 50 is fluid, semiconductor light-emitting element 10 which emits deep ultraviolet light 18 can be sealed just by injecting liquid 50 into the interior space of the package (30, 40). For that reason, according to light-emitting module 1 of the present embodiment, a highly reliable light-emitting module that has high light output power can be provided at a low cost.

Since liquid 50 is fluid, liquid 50 varies in shape according to a shape of the interior space of the package (30, 40). For that reason, according to light-emitting module 1 of the present embodiment, semiconductor light-emitting element 10 to be included in various types of light-emitting modules that include the packages (30, 40) having various shapes of the interior space can be readily and inexpensively sealed.

In light-emitting module 1 according to the present embodiment, liquid 50 may be any of the pure water, a liquid organic compound, a salt solution, and fine particle dispersion. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, the liquid organic compound may be any of a saturated hydrocarbon compound, an organic solvent having no aromatic ring, an organic halide, a silicone resin, and silicone oil. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, the salt solution may be any of an acid solution, a mineral salt solution, and an organic salt solution. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, liquid 50 may have an index of refraction of 1.32 or greater, preferably 1.40 or greater, and more preferably 1.45 or greater in the wavelength of deep ultraviolet light 18 emitted from semiconductor light-emitting element 10. For that reason, the index of refraction of liquid 50 in the wavelength of deep ultraviolet light 18 emitted from semiconductor light-emitting element 10 can be made even closer to the index of refraction of the light-emitting surface (second surface 11*b*) (the index of refraction of substrate 11) of semiconductor light-emitting element 10 in the wavelength of deep ultraviolet light 18. For that reason, deep ultraviolet light 18 emitted from active layer 13 of semiconductor light-emitting element 10 can further be reduced from being totally reflected off the light-emitting surface (second surface 11*b*) of semiconductor light-emitting element 10, thereby allowing deep ultraviolet light 18 emitted from active layer 13 of semiconductor light-emitting element 10 to be more efficiently extracted out of the light-emitting surface (second surface 11*b*) of semiconductor light-emitting element 10. As a result, according to light-emitting module 1 of the present embodiment, a light-emitting module having higher light output power can be provided.

In light-emitting module 1 of the present embodiment, liquid 50 may have an index of refraction smaller than the light-emitting surface (second surface 11*b*) of semiconductor light-emitting element 10 and greater than transparent member 40, in the wavelength of deep ultraviolet light 18 emitted from semiconductor light-emitting element 10. According to light-emitting module 1 of the present embodiment, the reflectivity at the interface between the light-emitting surface (second surface 11*b*) of semiconductor light-emitting element 10 and liquid 50, and the reflectivity at the interface between liquid 50 and transparent member 40 can be lowered. For that reason, according to light-emitting module 1 of the present embodiment, deep ultraviolet light 18 emitted from semiconductor light-emitting element 10 can be efficiently extracted out of the package (30,40), thereby providing a light-emitting module having higher light output power.

In light-emitting module 1 according to the present embodiment, liquid 50 may be composed of a material having a transmittance of 80% or greater per path length of 100 μm in the wavelength of deep ultraviolet light 18 emitted from semiconductor light-emitting element 10. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, liquid 50 may have a transmittance of 60% or greater, preferably 75%, and more preferably 90% or greater in the wavelength of deep ultraviolet light 18 emitted from semiconductor light-emitting element 10. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, transparent member 40 may be a cap. The cap has a shape of a shell that is open to one side and has an open space therein, and has a thickness sufficiently less than plates. Transparent member 40 which is a cap in light-emitting module 1 according to the present embodiment has a thickness sufficiently less than the thickness of the cured resin sealing semiconductor light-emitting element 10 in the light-emitting module according to Comparative Example 2. In light-emitting module 1 according to the present embodiment, the absorption of deep ultraviolet light 18 into transparent member 40, which is a cap, can be made lass than the absorption of deep ultraviolet light 18 into the cured resin in the light-emitting module according to Comparative Example 2. For that reason, according to light-emitting module 1 of the present embodiment, Improvement in extraction efficiency of deep ultraviolet light 18 out of the package (30, 40) is achieved.

In contrast, the thickness of the cured resin sealing semiconductor light-emitting element 10 in the light-emitting module according to Comparative Example 2 is sufficiently greater than the thickness of transparent member 40 which is a cap in light-emitting module 1 according to the present embodiment. The absorption of deep ultraviolet light 18 into the cured resin of the light-emitting module according to Comparative Example 2 is greater than the absorption of deep ultraviolet light 18 into transparent member 40 which is a cap of light-emitting module 1 according to the present embodiment. For that reason, the extraction efficiency of deep ultraviolet light 18 out of the light-emitting module according to Comparative Example 2 is hard to achieve.

Moreover, the thickness of transparent member 40, which is a cap, is thin. For that reason, the shape of transparent member 40, which is a cap, can be readily varied at a low cost. Furthermore, liquid 50 varies in shape freely according to a shape of the interior space of the package (30, 40). For that reason, according to light-emitting module 1 of the present embodiment, use of transparent member 40, which is a cap, and liquid 50 allows for readily and inexpensive fabrication of various types of light-emitting modules which include the packages (30, 40) having various shapes of interior space.

In contrast, in the light-emitting module according to Comparative Example 2 that is provided with semiconductor light-emitting element 10 sealed with a cured resin, the cured resin for sealing semiconductor light-emitting element 10 is fabricated by potting a resin into semiconductor light-emitting element 10 and then curing the resin. For that reason, it is difficult to mold the shape of the outer surface of the cured resin into an arbitrary shape. Moreover, in the light-emitting module according to Comparative Example 2 provided with semiconductor light-emitting element 10 sealed with a cured resin, the cured resin sealing the semiconductor light-emitting element 10 may be fabricated by casting a resin into the mold and then curing the resin. However, various shapes of molds need to be prepared correspondingly to various types of light-emitting modules that include the packages (30, 40) having various shapes of interior space. As a result, in the light-emitting module according to Comparative Example 2 provided with semiconductor light-emitting element 10 sealed with a cured resin, it is difficult to readily and inexpensively fabricate various types of light-emitting modules which include packages having various shapes of interior space.

In light-emitting module 1 according to the present embodiment, transparent member 40 may have a shape of a semi-sphere shell. Transparent member 40 having the shape of the semi-sphere shell can make the angle of incidence of deep ultraviolet light 18, emitted from semiconductor light-emitting element 10 onto transparent member 40, close to perpendicular to transparent member 40. For that reason, deep ultraviolet light 18 emitted from semiconductor light-emitting element 10 can be inhibited from being reflected off transparent member 40, thereby improving the extraction efficiency of deep ultraviolet light 18 out of the package (30, 40).

In contrast, in the light-emitting module according to Comparative Example 2 that is provided with semiconductor light-emitting element 10 sealed with a cured resin, since a resin is potted into semiconductor light-emitting element 10 and then cured, it is difficult to form the outer surface of the cured resin into a semi-sphere shape. For that reason, in the light-emitting module according to Comparative Example 2 provided with semiconductor light-emitting element 10 sealed with a cured resin, it is difficult to effectively inhibit deep ultraviolet light 18 emitted from semiconductor light-emitting element 10 from being reflected off the outer surface of the cured resin.

In light-emitting module 1 according to the present embodiment, transparent member 40 may be composed of any of synthetic quartz, quartz glass, alkali-free glass, sapphire, fluorite, and a resin. The synthetic quartz, quartz glass, alkali-free glass, sapphire, fluorite, and resin all have low light absorptances and high light transmittances to deep ultraviolet light 18 having a wavelength of 190 nm or greater and 350 nm or less, preferably 200 nm or greater and 320 nm or less, and more preferably 220 nm or greater and 300 nm or less. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, transparent member 40 may be composed of a material having a transmittance of 80% or greater per path length of 100 μm in the wavelength of deep ultraviolet light 18 emitted from semiconductor light-emitting element 10. For that reason, according to light-emitting module 1 of the present embodiment, a highly reliable light-emitting module that has high light output power and is provided with semiconductor light-emitting element 10 that emits deep ultraviolet light 18, can be provided.

In light-emitting module 1 according to the present embodiment, transparent member 40 may have a transmittance of 60% or greater, preferably 75%, more preferably 90% or greater in the wavelength of deep ultraviolet light 18 emitted from semiconductor light-emitting element 10. For that reason, according to light-emitting module 1 of the present embodiment, a highly reliable light-emitting module that has high light output power and is provided with semiconductor light-emitting element 10 that emits deep ultraviolet light 18, can be provided.

Embodiment 2

Figure 5:
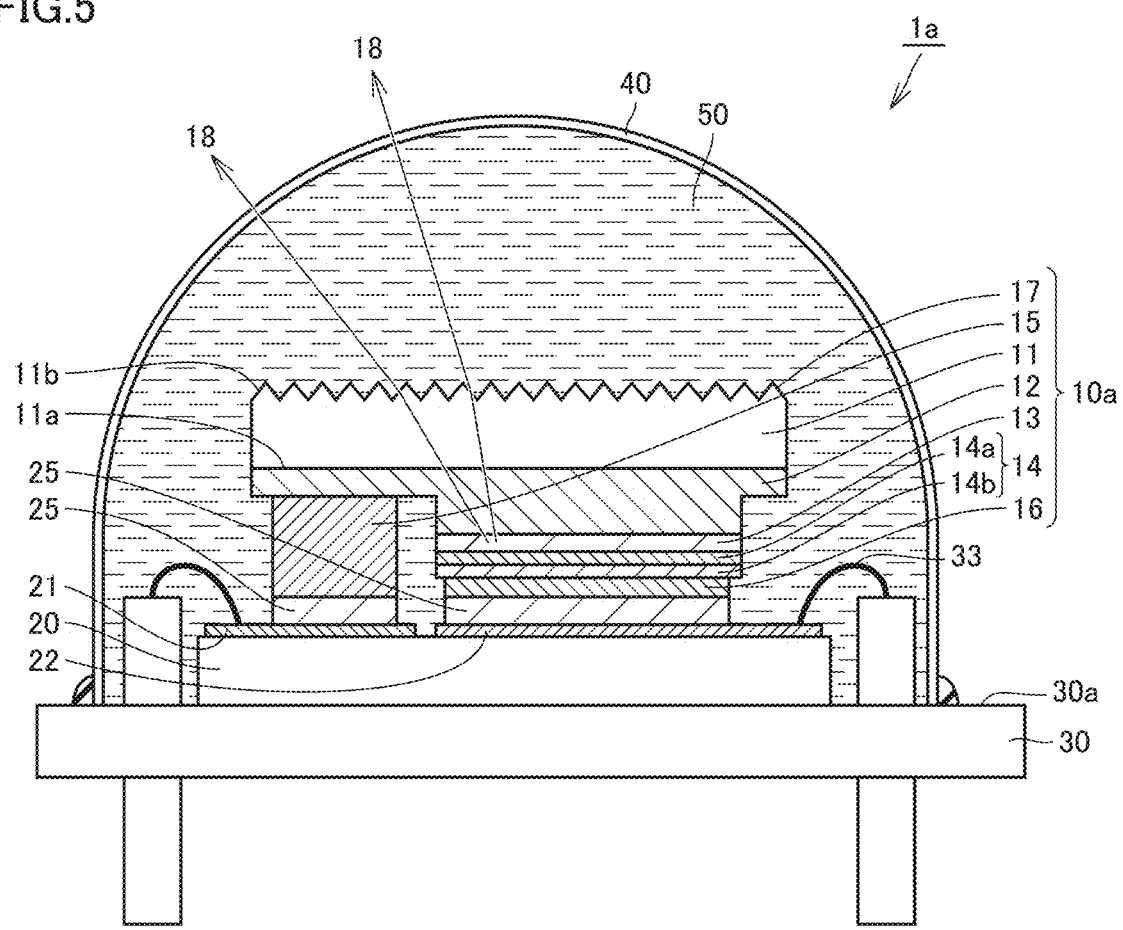
FIG. 5 is a schematic cross sectional view of a light-emitting module according to Embodiment 2.

Referring to FIG. 5, a light-emitting module 1a according to Embodiment 2 will be described. Light-emitting module 1a according to the present embodiment basically has a similar configuration and yields similar advantageous effects to those of light-emitting module 1 according to Embodiment 1 shown in FIG. 1, and mainly differs in the following points.

In light-emitting module 1a according to the present embodiment, a semiconductor light-emitting element 10a includes a recess and projection structure 17 which allows improvement in efficiency of extracting deep ultraviolet light 18, emitted from an active layer 13 of semiconductor light-emitting element 10a, out of semiconductor light-emitting element 10a. More specifically, a recess and projection structure 17 which allows improvement in efficiency of extracting deep ultraviolet light 18 out of semiconductor light-emitting element 10a may be included in the light-emitting surface (second surface 11b) of semiconductor light-emitting element 10a. Recess and projection structure 17 allows deep ultraviolet light 18 emitted from active layer 13 of semiconductor light-emitting element 10a to be reduced from being totally reflected off the light-emitting surface (second surface 11b) of semiconductor light-emitting element 10a. For that reason, providing a recess and projection structure 17 to semiconductor light-emitting element 10a allows improvement in efficiency of extracting deep ultraviolet light 18 out of semiconductor light-emitting element 10a. According to light-emitting module 1a of the present embodiment, a highly reliable light-emitting module that has higher light output power and is provided with semiconductor light-emitting element 10a that emits deep ultraviolet light 18, can be provided.

Recess and projection structure 17 may have recesses and protrusions arranged at random. Recess and projection structure 17 may have recesses and protrusions arranged periodically. Recess and projection structure 17 may also be arranged in a triangular lattice, a square lattice, or a hexagonal lattice. Preferably, recess and projection structure 17 is arranged in a triangular lattice which maximizes the filling factor. The recesses or protrusions of recess and projection structure 17 may be shaped in a prism, a cylinder, a cone, a pyramid, a sphere, or a semi-elliptical sphere.

Referring to (A) of FIG. 6, a method for fabricating semiconductor light-emitting element 10a included in light-emitting module 1a according to the present embodiment will be described. An example of the method for fabricating semiconductor light-emitting element 10a of light-emitting module 1a according to the present embodiment is basically the same as the fabrication method illustrated in (B) of FIG. 2, and differs in that the method includes a step (S17) of forming recess and projection structure 17 on the second surface of the wafer opposite the first surface after the step (S16) of forming of p-type electrode 16. After the wafer is diced, the second surface of the wafer becomes second surface 11b of substrate 11.

Figure 6:
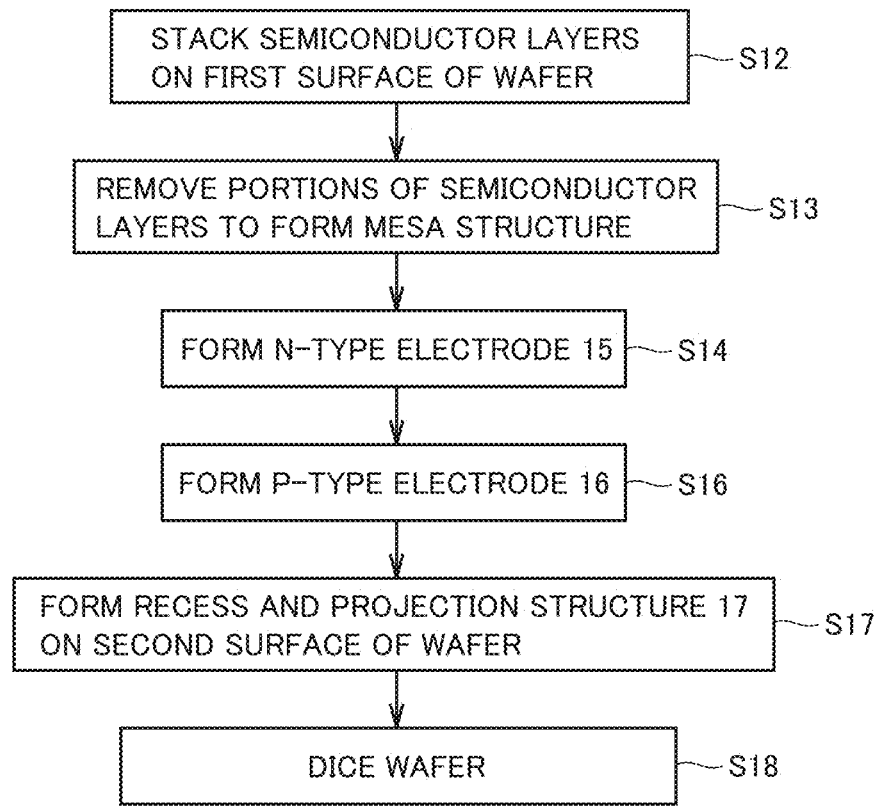
FIG. 6 includes: (A) a flowchart for a method for fabricating a semiconductor light-emitting element included in the light-emitting module according to Embodiment 2; and (B) a flowchart for a step of forming a recess and projection structure on the semiconductor light-emitting element included in the light-emitting module according to Embodiment 2.
Figure 6:
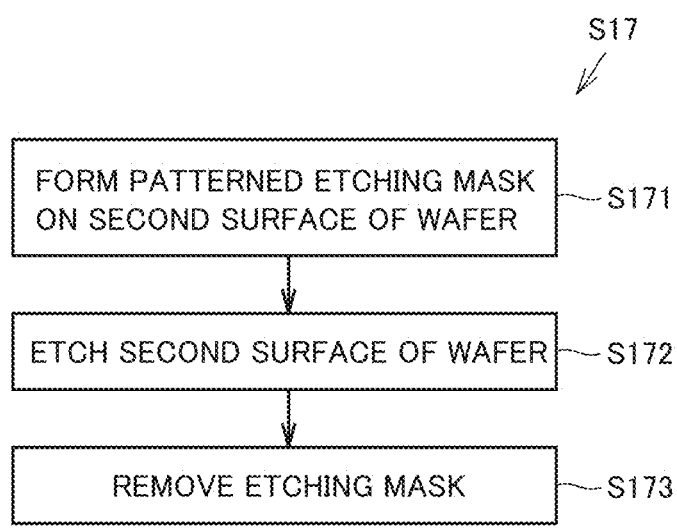

Referring to (B) of FIG. 6, the step (S17) of forming recess and projection structure 17 on the second surface of the wafer may include the following steps. A patterned etching mask is formed on the second surface of the wafer, the second surface being opposite the first surface on which the semiconductor layers, including n-type semiconductor layer 12, active layer 13, and p-type semiconductor layer 14, are formed (S171). Using the patterned etching mask, the second surface of the wafer is etched (S172). At last, the etching mask is removed (S173).

The step (S171) of forming the patterned etching mask may be carried out by electron beam writing, photolithography, or nanoimprinting, for example. The step (S172) of etching the second surface 11b of substrate 11 using the patterned etching mask may be carried out by ICP (Inductively Coupled Plasma) etching, dry etching such as RIE (Reactive Ion Etching), or wet etching that uses an acid solution or alkaline solution as etchant.

Light-emitting module 1a according to the present embodiment has the following actions and effects, in addition to the actions and effects of light-emitting module 1 according to Embodiment 1.

In light-emitting module 1a according to the present embodiment, semiconductor light-emitting element 10a may include recess and projection structure 17 for improving the efficiency in extracting deep ultraviolet light 18, emitted from active layer 13 of semiconductor light-emitting element 10a, out of semiconductor light-emitting element 10a. Recess and projection structure 17 allows deep ultraviolet light 18 emitted from active layer 13 of semiconductor light-emitting element 10a to be reduced from being totally reflected off the light-emitting surface (second surface 11b) of semiconductor light-emitting element 10a. For that reason, providing recess and projection structure 17 to semiconductor light-emitting element 10a allows improvement in efficiency of extracting deep ultraviolet light 18 out of semiconductor light-emitting element 10a. According to light-emitting module 1a of the present embodiment, a highly reliable light-emitting module that has higher light output power and is provided with semiconductor light-emitting element 10a that emits deep ultraviolet light 18, can be provided.

Light-emitting module 1a according to the present embodiment may include semiconductor light-emitting element 10a and a liquid 50 sealing semiconductor light-emitting element 10a, and semiconductor light-emitting element 10a may include recess and projection structure 17 for improving the efficiently in extracting deep ultraviolet light 18, emitted from active layer 13 of semiconductor light-emitting element 10a, out of semiconductor light-emitting element 10a. Liquid 50 is more fluid than cured resins and thus can tightly fill the recesses of recess and projection structure 17. In general, the index of refraction of liquid 50 is greater than the index of refraction of air. For that reason, the difference can be reduced between: the index of refraction of liquid 50 in the wavelength of deep ultraviolet light 18; and the index of refraction, in the wavelength of deep ultraviolet light 18, of the surface having recess and projection structure 17 of semiconductor light-emitting element 10a formed thereon. According to light-emitting module 1a of the present embodiment, deep ultraviolet light 18 emitted from active layer 13 of semiconductor light-emitting element 10a is reduced, by recess and projection structure 17 and liquid 50, from being totally reflected off the light-emitting surface (second surface 11b) of semiconductor light-emitting element 10, thereby efficiently extracting deep ultraviolet light 18, emitted from active layer 13 of semiconductor light-emitting element 10a, out of semiconductor light-emitting element 10. As a result, according to light-emitting module 1a of the present embodiment, a light-emitting module that is highly reliable and has high light output power can be provided.

Figure 7:
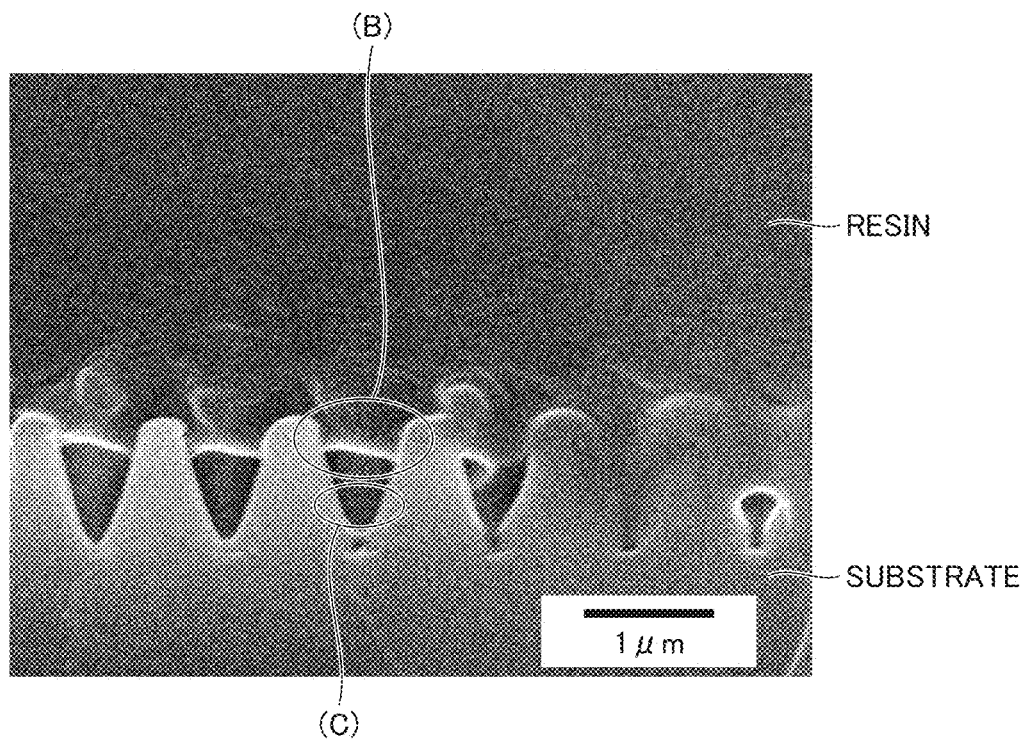
FIG. 7 includes: (A) a diagram showing a cross-sectional SEM image of the recess and projection structure of the light-emitting module according to Embodiment 2; (B) an enlarged partial view of the cross-sectional SEM image of the recess and projection structure of the light-emitting module according to Embodiment 2; and (C) another enlarged partial view of the cross-sectional SEM image of the recess and projection structure of the light-emitting module according to Embodiment 2.
Figure 7:
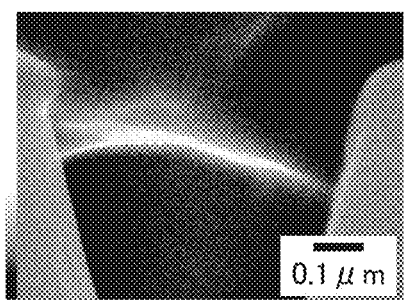
Figure 7:
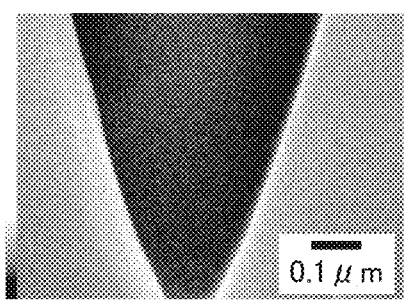

In contrast, referring to (A) through (C) of FIG. 7, when semiconductor light-emitting element 10a having recess and projection structure 17 formed thereon is sealed with a cured resin, the cured resin creates voids in some of the recesses of recess and projection structure 17. The voids are considered to be created due to lack of impregnation of the resin into some of the recesses of recess and projection structure 17 before the resin is cured, or thermal contraction of the resin when being cured. In the voids in recess and projection structure 17, semiconductor light-emitting element 10a contacts with air, gas, or a vacuum that has a low index of refraction. For that reason, it is difficult to extract, at a high efficiency, deep ultraviolet light 18, emitted from active layer 13 of semiconductor light-emitting element 10a, out of semiconductor light-emitting element 10a through the light-emitting surface of semiconductor light-emitting element 10 that is in contact with the voids. As a result, even with the introduction of recess and projection structure 17 into semiconductor light-emitting element 10a, improvement in efficiently of extracting deep ultraviolet light 18 out of semiconductor light-emitting element 10a is limited by the voids that are created by sealing the semiconductor light-emitting element 10a having recess and projection structure 17 formed thereon with a cured resin.

Embodiment 3

Figure 8:
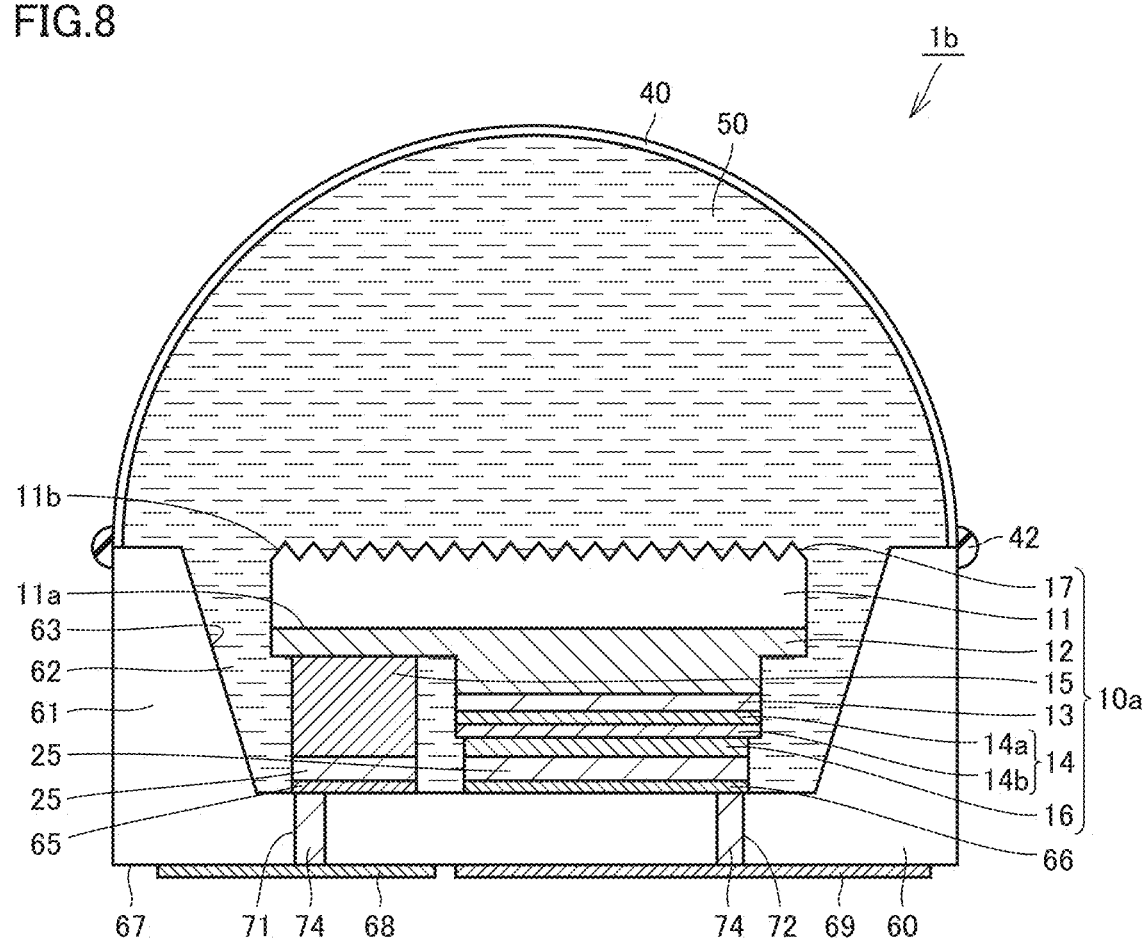
FIG. 8 is a schematic cross sectional view of a light-emitting module according to Embodiment 3.

Referring to FIG. 8, a light-emitting module 1b according to Embodiment 3 will be described. Light-emitting module 1b according to the present embodiment basically has a similar configuration and yields similar advantageous effects to those of light-emitting module 1a according to Embodiment 2 shown in FIG. 5, and mainly differs in the following points.

Light-emitting module 1b according to the present embodiment includes a package (40, 60) which includes a base 60 and a transparent member 40. The package (40, 60) according to the present embodiment includes base 60 in place of base 30 according to Embodiment 1. Examples of materials used for base 60 can include metals, resins, and ceramics. In the present specification, the package (40, 60) that includes base 60 made of a metal will be referred to as a metal package, the package (40, 60) that includes base 60 made of a resin will be referred to as a resin package, and the package (40, 60) that includes base 60 made of a ceramic will be referred to as a ceramic package. The package (40, 60) according to the present embodiment may be any of the metal package, the resin package, or the ceramic package. Base 60 may be composed of a highly thermally conductive material, and serve as a heat sink. In the present embodiment, aluminum nitride (AlN) may be used as the material for base 60.

Base 60 is provided with a side wall 61 around it. A recess 62 for accommodating semiconductor light-emitting element 10a is formed inside the side wall 61. Side wall 61 has a side face 63 facing recess 62. A first conductive pad 65 and a second conductive pad 66 are provided on the bottom surface of recess 62 of base 60. Base 60 has a surface 67 on the opposite side of recess 62. A third conductive pad 68 and a fourth conductive pad 69 are provided on surface 67 of base 60. In order to improve extraction efficiency of deep ultraviolet light 18 from light-emitting module 1b according to the present embodiment, a reflecting film may be provided on the bottom surface of recess 62 of base 60, and side face 63.

Base 60 has a first through-hole 71 and a second through-hole 72. First through-hole 71 and second through-hole 72 connect recess 62 and surface 67. A conductive member 74 is provided in first through-hole 7 land second through-hole 72. Conductive members 74 connect recess 62 and surface 67.

Semiconductor light-emitting element 10a may be mounted on base 60. Using an electrically conductive bond member 25, an n-type electrode 15 of semiconductor light-emitting element 10a and first conductive pad 65 of base 60 are electrically and mechanically connected, and a p-type electrode 16 of semiconductor light-emitting element 10a and second conductive pad 66 of base 60 are electrically and mechanically connected. In the present embodiment, current is supplied from an external power supply (not shown) to semiconductor light-emitting element 10a via bond member 25, first conductive pad 65, second conductive pad 66, conductive member 74, third conductive pad 68, and fourth conductive pad 69, and semiconductor light-emitting element 10a emits deep ultraviolet light 18.

Light-emitting module 1b according to the present embodiment has the following actions and effects, in addition to the actions and effects of light-emitting module 1a according to Embodiment 2.

Since light-emitting module 1b according to the present embodiment does not employ a conductive wire for supplying the current from the external power supply to semiconductor light-emitting element 10a, a wire bonding step can be obviated. For that reason, according to light-emitting module 1b of the present embodiment, improved productivity and a decreased production cost of the light-emitting module are achieved.

Since liquid 50 is fluid, liquid 50 varies in shape according to a shape of the interior space of the package (40, 60). For that reason, even with the package (40, 60) according to the present embodiment that has a different shape of the interior space than the package (30, 40) according to Embodiment 1, semiconductor light-emitting element 10a can be readily and inexpensively sealed with liquid 50.

Embodiment 4

Figure 9:
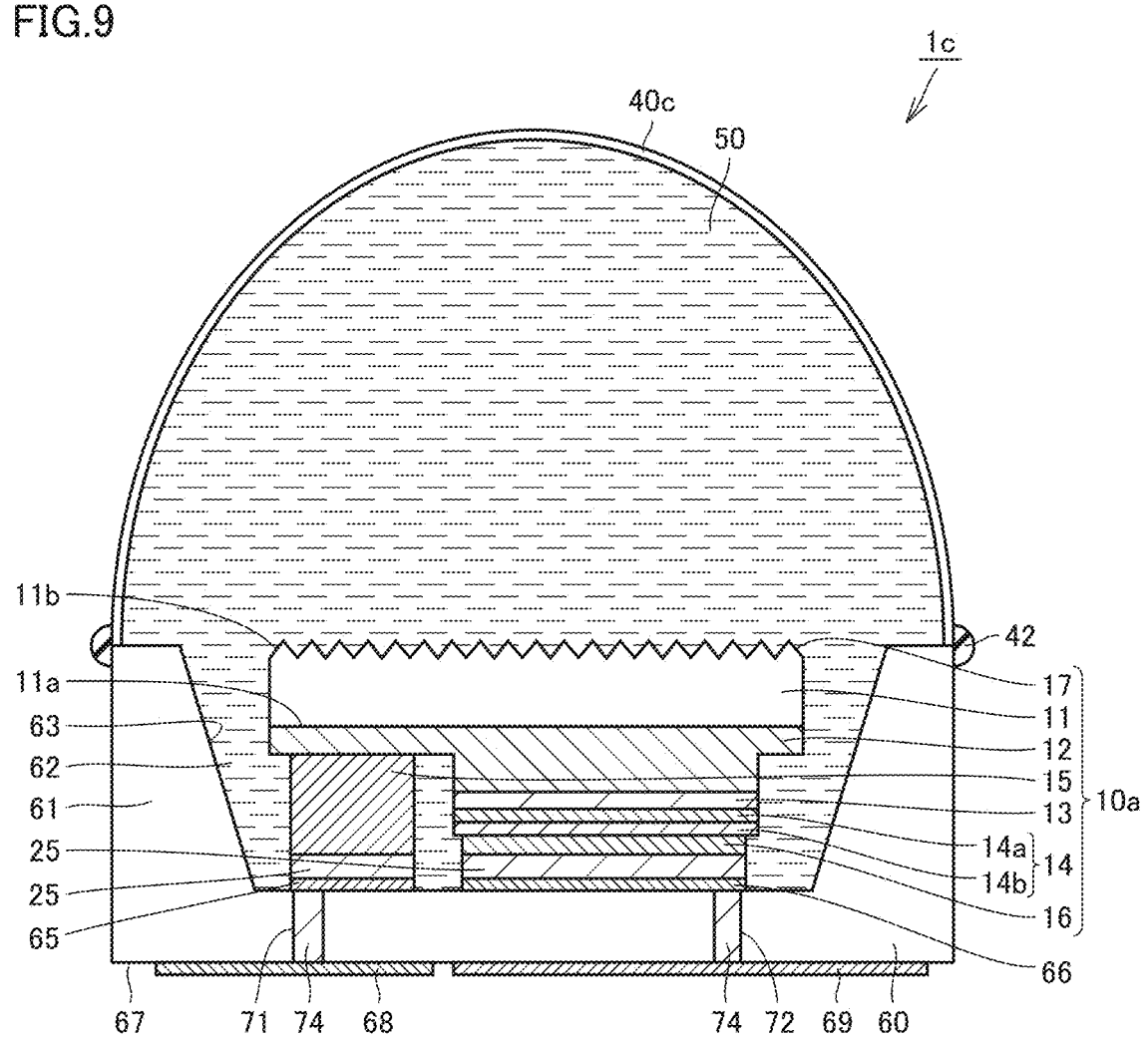
FIG. 9 is a schematic cross sectional view of a light-emitting module according to Embodiment 4.

Referring to FIG. 9, a light-emitting module 1c according to Embodiment 4 will be described. Light-emitting module 1c according to the present embodiment basically has a similar configuration and yields similar advantageous effects to those of light-emitting module 1b according to Embodiment 3 shown in FIG. 8, and mainly differs in the following points.

Light-emitting module 1c according to the present embodiment includes a package (40c, 60) which includes a base 60 and a transparent member 40c. Transparent member 40c may be a cap having a shape of any of a semi-elliptical sphere shell and a shell having a bullet shape. Deep ultraviolet light 18 emitted from semiconductor light-emitting element 10a is refracted by transparent member 40c which is a cap. For that reason, transparent member 40c, which is a cap, having the shape of any of a semi-elliptical sphere shell and a shell having a bullet shape allows light distribution characteristics of deep ultraviolet light 18 emitted from semiconductor light-emitting element 10a to be altered over a wide range.

Since liquid 50 is fluid, liquid 50 varies in shape according to a shape of the interior space of the package (40c, 60). For that reason, even with the package (40c, 60) according to the present embodiment that has a different shape of the interior space than the package (40, 60) according to Embodiment 3, semiconductor light-emitting element 10a can be readily and inexpensively sealed with liquid 50.

Embodiment 5

Figure 10:
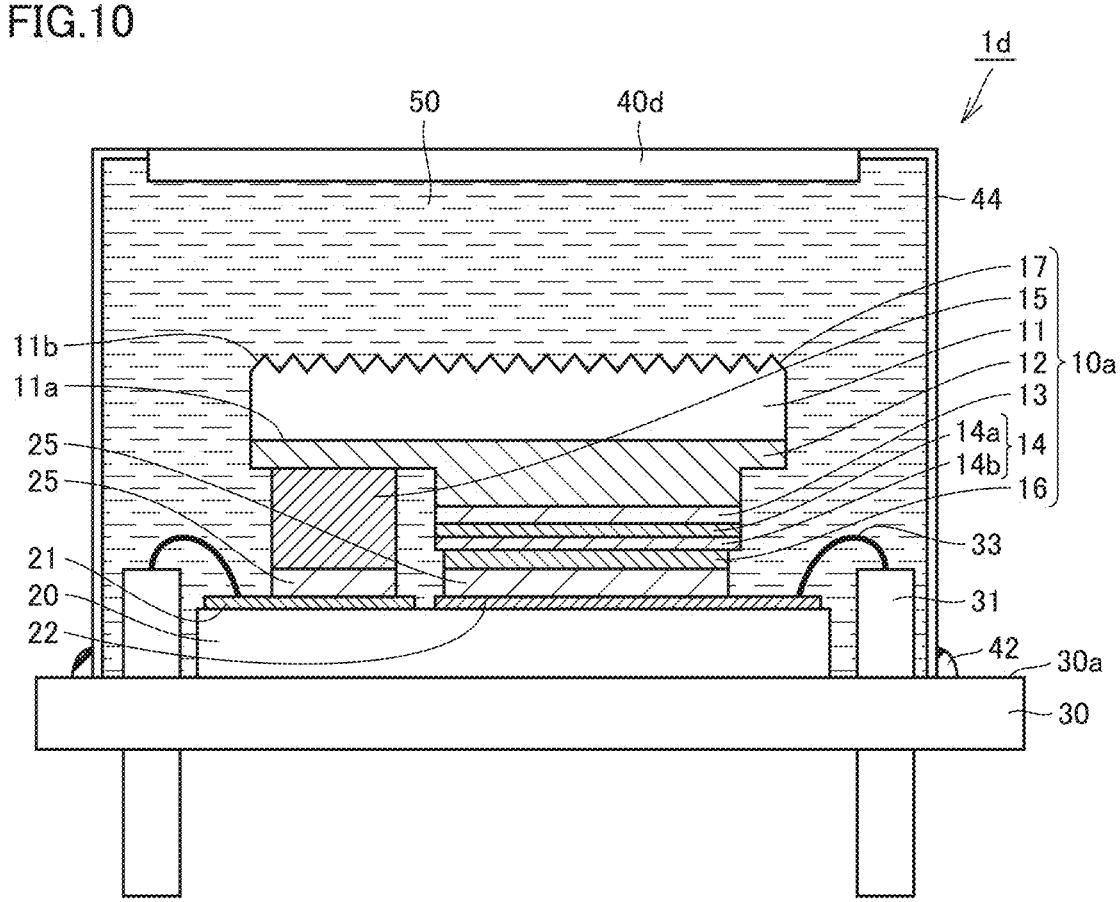
FIG. 10 is a schematic cross sectional view of a light-emitting module according to Embodiment 5.

Referring to FIG. 10, a light-emitting module 1d according to Embodiment 5 will be described. Light-emitting module 1d according to the present embodiment basically has a similar configuration and yields similar advantageous effects to those of light-emitting module 1a according to Embodiment 2 shown in FIG. 5, and mainly differs in the following points.

Light-emitting module 1d according to the present embodiment includes a package (40d, 44, 30) which includes a base 30, a transparent member 40d, and a cap 44. In the present embodiment, transparent member 40d is a flat plate. Cap 44 mechanically supports transparent member 40d. Examples of materials used for cap 44 can include metals or resins. Cap 44 may be secured to base 30 by an adhesive 42 or welding, for example.

As with transparent member 40 according to Embodiment 1, transparent member 40d may be composed of any of synthetic quartz, quartz glass, alkali-free glass, sapphire, fluorite, or a resin.

Since liquid 50 is fluid, liquid 50 varies in shape according to a shape of the interior space of the package (40d, 44, 30). For that reason, even with the package (40d, 44, 30) according to the present embodiment that has a different shape of the interior space than the package (30, 40) according to Embodiment 1, semiconductor light-emitting element 10a can be readily and inexpensively sealed with liquid 50.

Embodiment 6

Figure 11:
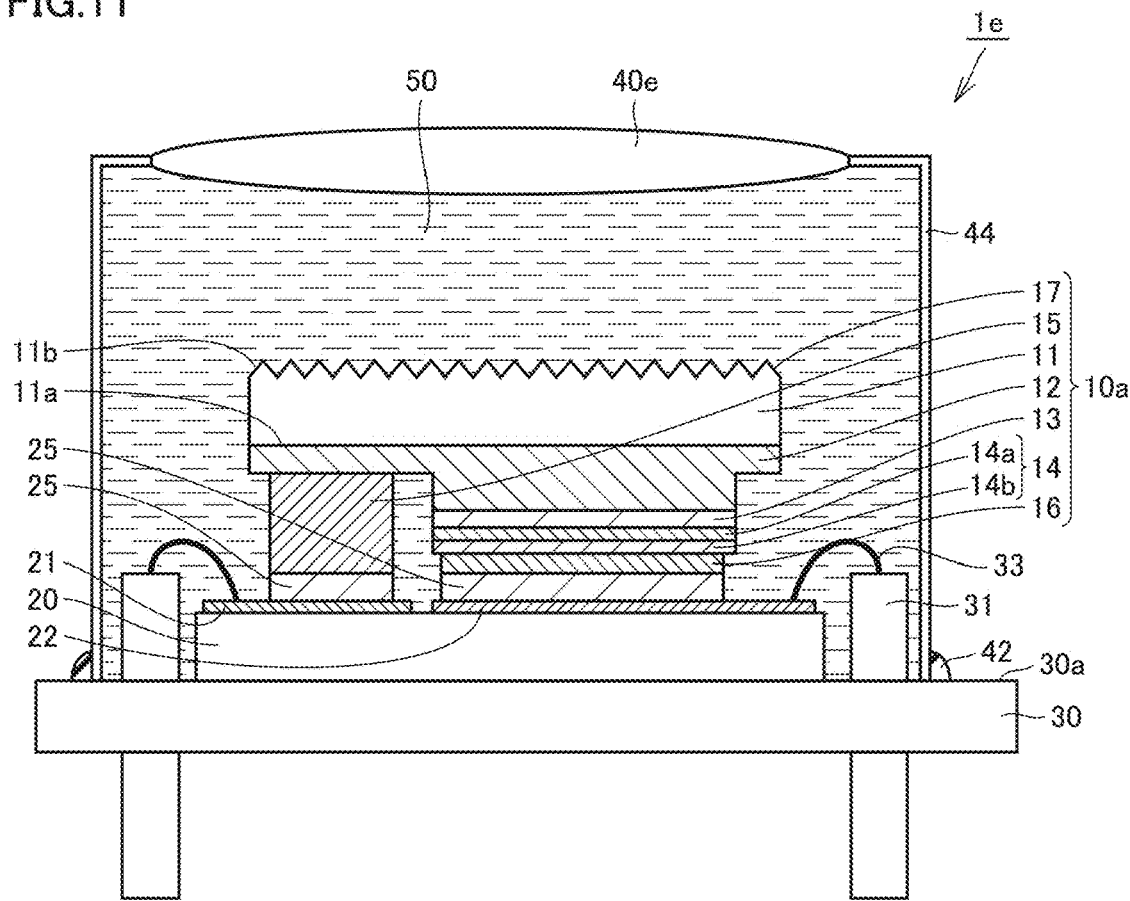
FIG. 11 is a schematic cross sectional view of a light-emitting module according to Embodiment 6.

Referring to FIG. 11, a light-emitting module 1e according to Embodiment 6 will be described. Light-emitting module 1e according to the present embodiment basically has a similar configuration and yields similar advantageous effects to those of light-emitting module 1d according to Embodiment 5 shown in FIG. 10, and mainly differs in the following points.

Light-emitting module 1e according to the present embodiment includes a package (40e, 44, 30) which includes a base 30, a transparent member 40e, and a cap 44. In light-emitting module 1e according to the present embodiment, the package (40e, 44, 30) includes a transparent member 40e in place of transparent member 40d according to Embodiment 5. Transparent member 40e is a lens.

In light-emitting module 1e according to the present embodiment, transparent member 40e is a lens. Deep ultraviolet light 18 emitted from semiconductor light-emitting element 10a can be refracted by transparent member 40e which is a lens. For that reason, light distribution characteristics of deep ultraviolet light 18 emitted from semiconductor light-emitting element 10a is alterable by transparent member 40e which is a lens.

Embodiment 7

Figure 12:
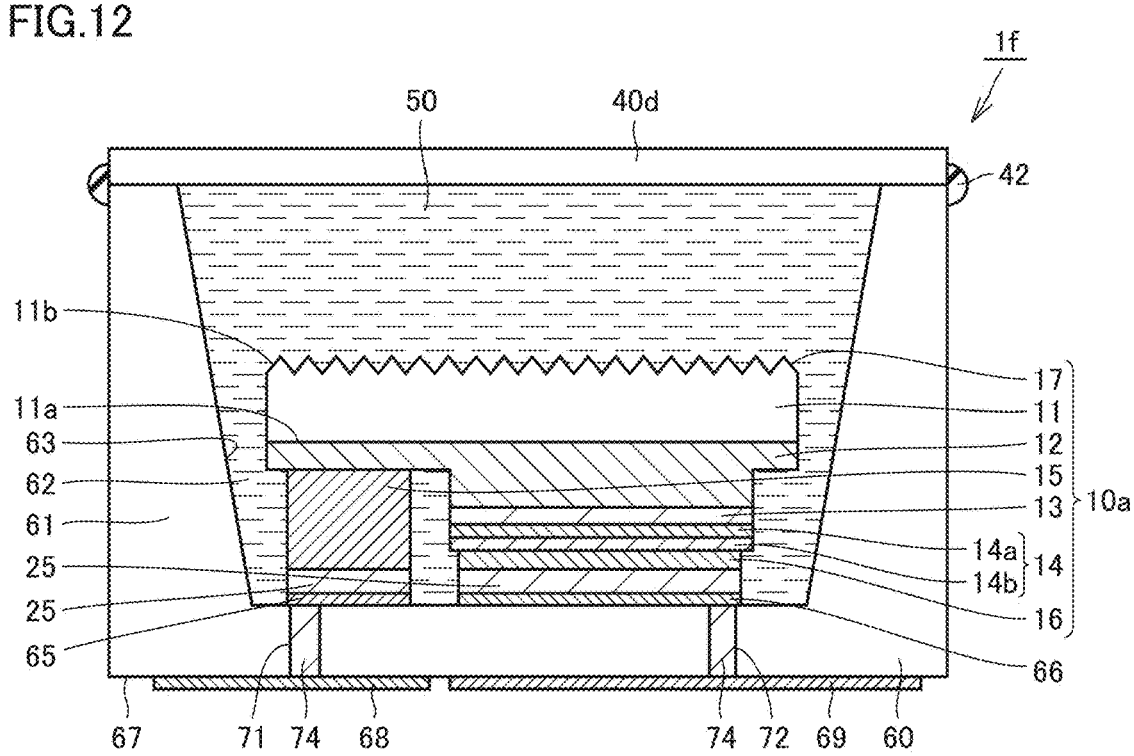
FIG. 12 is a schematic cross sectional view of a light-emitting module according to Embodiment 7.

Referring to FIG. 12, a light-emitting module 1f according to Embodiment 7 will be described. Light-emitting module 1f according to the present embodiment basically has a similar configuration and yields similar advantageous effects to those of light-emitting module 1d according to Embodiment 5 shown in FIG. 10, and mainly differs in the following points.

Light-emitting module 1f according to the present embodiment includes a package (40d, 60) which includes a base 60 and a transparent member 40d. In light-emitting module 1f according to the present embodiment, the package (40d, 60) includes base 60 according to Embodiment 3 in place of base 30 according to Embodiment 5. The peripheral edge of transparent member 40d rests on top of a side wall 61 of base 60, and transparent member 40d is mechanically supported by side wall 61 of base 60. The peripheral edge of transparent member 40d is secured on side wall 61 of base 60, using an adhesive 42, for example.

An example of the method for fabricating light-emitting module 1f according to the present embodiment may include the following fabrication method. Semiconductor light-emitting element 10a is prepared. Semiconductor light-emitting element 10a is mounted on the bottom surface of base 60. A liquid is discharged through a nozzle, thereby filling the interior of a recess 62 of base 60 with liquid 50. An opening of recess 62, filled with liquid 50, of base 60 is covered with transparent member 40d, which is a flat plate. The peripheral edge of transparent member 40d is secured on side wall 61 of base 60, using an adhesive 42, for example.

Light-emitting module 1f according to the present embodiment has the actions and effects of base 60 according to Embodiment 3, in addition to the actions and effects of light-emitting module 1f according to Embodiment 5.

Embodiment 8

Figure 13:
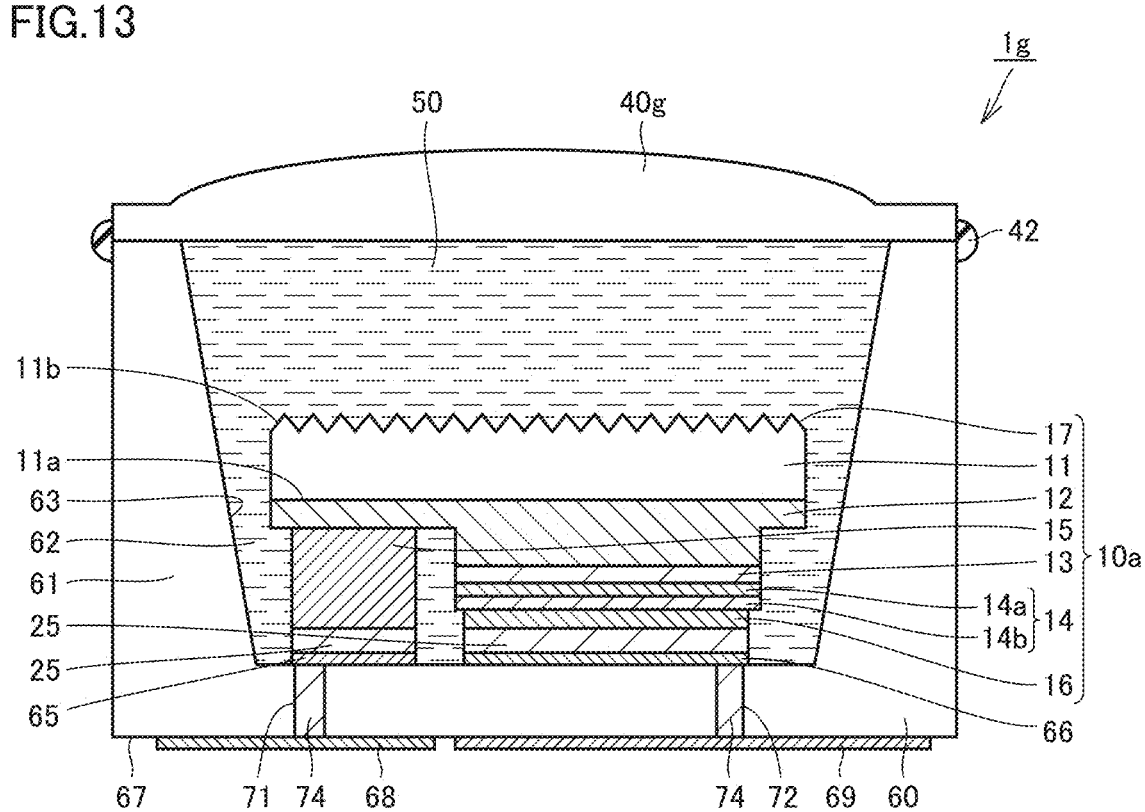
FIG. 13 is a schematic cross sectional view of a light-emitting module according to Embodiment 8.

Referring to FIG. 13, a light-emitting module 1g according to Embodiment 8 will be described. Light-emitting module 1g according to the present embodiment basically has a similar configuration and yields similar advantageous effects to those of light-emitting module 1f according to Embodiment 7 shown in FIG. 12, and mainly differs in the following points.

Light-emitting module 1g according to the present embodiment includes a package (40g, 60) which includes a base 60 and a transparent member 40g. In light-emitting module 1g according to the present embodiment, the package (40g, 60) includes transparent member 40g in place of transparent member 40d according to Embodiment 8. Transparent member 40g is a transparent plate having a lens formed on the surface. The peripheral edge of transparent member 40g rests on top of a side wall 61 of base 60, and transparent member 40g is mechanically supported by side wall 61 of base 60. Transparent member 40g is secured on side wall 61 of base 60, using an adhesive 42, for example.

In light-emitting module 1g according to the present embodiment, transparent member 40g is a transparent plate having a lens formed on the surface. Deep ultraviolet light 18 emitted from semiconductor light-emitting element 10a can be refracted by the lens of transparent member 40g. For that reason, light distribution characteristics of deep ultraviolet light 18 emitted from semiconductor light-emitting element 10a is alterable by transparent member 40g.

The presently disclosed embodiments are should be considered in all aspects illustrative and not restrictive. The scope of the present invention is defined by the appended claims, rather than by the description above, and all changes which come within the meaning and range of equivalency of the appended claims are intended to be included within the scope of the present invention.

REFERENCE SIGNS LIST 1, 1a, 1b, 1c, 1d, 1e, 1f, 1g light-emitting module; 4, 40, 40d, 40e, 40g transparent member; 10, 10a semiconductor light-emitting element; 11 substrate; 11a first surface; 11b second surface; 12 n-type semiconductor layer; 13 active layer; 14 p-type semiconductor layer; 14a first p-type semiconductor layer; 14b second p-type semiconductor layer; 15 n-type electrode; 16 p-type electrode; 17 recess and projection structure; 18 ultraviolet light; 20 sub-mount; 21 first conductive pad; 22 second conductive pad; 25 bond member; 30 base; 30a primary surface; 31 lead pin; 33 conductive wire; 42 adhesive; 44 cap; 50 liquid; 52 nozzle; 60 base; 61 side wall; 62 recess; 63 side face; 65 first conductive pad; 66 second conductive pad; 67 surface; 68 third conductive pad; 69 fourth conductive pad; 71 first through-hole; 72 second through-hole; and 74 conductive member.

The invention claimed is:
1. A light-emitting module, comprising:
a semiconductor light-emitting element which emits deep ultraviolet light;
a liquid entirely sealing the semiconductor light-emitting element, the liquid being transparent to the deep ultraviolet light emitted from the semiconductor light-emitting element, the liquid being more fluid than a cured resin and not including phosphors; and
a package for accommodating the semiconductor light-emitting element and the liquid, the package having a transparent member transparent to the deep ultraviolet light emitted from the semiconductor light-emitting element, wherein
the semiconductor light-emitting element includes an uneven structure that extracts the deep ultraviolet light emitted from an active layer of the semiconductor light-emitting element out of the semiconductor light-emitting element, a recess of the uneven structure is filled with the liquid and does not include any void, the recess and a protrusion of the uneven structure are arranged periodically, a periodic length of the uneven structure is less than or equal to 1 μm, and the liquid is any of a liquid organic compound, a salt solution, and a fine particle dispersion.

2. The light-emitting module according to claim 1, wherein the liquid organic compound is any of a saturated hydrocarbon compound, an organic solvent having no aromatic ring, an organic halide, a silicone resin, and silicone oil.

3. The light-emitting module according to claim 1, wherein the salt solution is any of an acid solution, a mineral salt solution, and an organic salt solution.

4. The light-emitting module according to claim 1, wherein the liquid has an index of refraction of 1.32 or greater in a wavelength of the deep ultraviolet light emitted from the semiconductor light-emitting element.

5. The light-emitting module according to claim 1, wherein the liquid has an index of refraction of 1.40 or greater in a wavelength of the deep ultraviolet light emitted from the semiconductor light-emitting element.

6. The light-emitting module according to claim 1, wherein in a wavelength of the deep ultraviolet light emitted from the semiconductor light-emitting element, the liquid has an index of refraction smaller than a light-emitting surface of the semiconductor light-emitting element and greater than the transparent member.

7. The light-emitting module according to claim 1, wherein the liquid is composed of a material having a transmittance of 80% or greater per path length of 100 μm in a wavelength of the deep ultraviolet light emitted from the semiconductor light-emitting element.

8. The light-emitting module according to claim 1, wherein the liquid has a transmittance of 60% or greater in a wavelength of the deep ultraviolet light emitted from the semiconductor light-emitting element.

9. The light-emitting module according to claim 1, wherein the liquid has a transmittance of 75% or greater in a wavelength of the deep ultraviolet light emitted from the semiconductor light-emitting element.

10. The light-emitting module according to claim 1, wherein the transparent member is a cap.

11. The light-emitting module according to claim 1, wherein the transparent member has a shape of any of a semi-sphere shell, a semi-elliptical sphere shell, and a shell having a bullet shape.

12. The light-emitting module according to claim 1, wherein the transparent member is a flat plate, a lens, or a transparent plate having a lens formed on a surface of the transparent plate.

13. The light-emitting module according to claim 1, wherein the transparent member is made of any of synthetic quartz, quartz glass, alkali-free glass, sapphire, fluorite, and a resin.

14. The light-emitting module according to claim 1, wherein the transparent member is composed of a material having a transmittance of 80% or greater per path length of 100 μm in a wavelength of the deep ultraviolet light emitted from the semiconductor light-emitting element.

15. The light-emitting module according to claim 1, wherein the transparent member has a transmittance of 60% or greater in a wavelength of the deep ultraviolet light emitted from the semiconductor light-emitting element.

16. The light-emitting module according to claim 1, wherein the package is any of a metal package, a resin package, and a ceramic package.

17. The light-emitting module according to claim 1, wherein the deep ultraviolet light emitted from the semiconductor light-emitting element has a wavelength of 190 to 350 nm.

18. The light-emitting module according to claim 1, wherein the deep ultraviolet light emitted from the semiconductor light-emitting element has a wavelength of 200 to 320 nm.

19. The light-emitting module according to claim 1, wherein the periodic length of the uneven structure is greater than or equal to a wavelength of the deep ultraviolet light.

* * * * *